US007008809B2

(12) United States Patent
Hasei

(10) Patent No.: US 7,008,809 B2
(45) Date of Patent: Mar. 7, 2006

(54) PATTERN FORMATION METHOD AND PATTERN FORMATION APPARATUS, METHOD FOR MANUFACTURING DEVICE, ELECTRO-OPTICAL DEVICE, ELECTRONIC DEVICE, AND METHOD FOR MANUFACTURING ACTIVE MATRIX SUBSTRATE

(75) Inventor: Hironori Hasei, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/843,418

(22) Filed: May 12, 2004

(65) Prior Publication Data

US 2005/0009230 A1 Jan. 13, 2005

(30) Foreign Application Priority Data

| | | | |
|---|---|---|---|
| May 16, 2003 | (JP) | ............................ | 2003-139191 |
| May 16, 2003 | (JP) | ............................ | 2003-139192 |
| Mar. 29, 2004 | (JP) | ............................ | 2004-095976 |

(51) Int. Cl.
*H01L 21/00* (2006.01)

(52) U.S. Cl. ............................ 438/30; 438/98; 438/70

(58) Field of Classification Search .................. 438/30, 438/31, 32, 42, 65, 69, 98, 151, 161, 680, 438/70

See application file for complete search history.

(56) References Cited

U.S. PATENT DOCUMENTS

2003/0142167 A1 * 7/2003 Nakamura et al. ............ 347/37
2003/0151637 A1 * 8/2003 Nakamura et al. ............ 347/20

FOREIGN PATENT DOCUMENTS

JP A 11-274671 10/1999
JP A 2000-216330 8/2000

* cited by examiner

*Primary Examiner*—David Nhu
(74) *Attorney, Agent, or Firm*—Oliff & Berridge, PLC

(57) ABSTRACT

A pattern formation method for forming a film pattern upon a substrate, including the steps of: forming banks in a predetermined pattern upon the substrate; disposing liquid drops of a functional liquid at the end portions of groove portions which are defined between the banks; and after having disposed the drops at the end portions of the groove portions, disposing liquid drops in positions of the groove portions other than the end portions thereof.

21 Claims, 23 Drawing Sheets

PATTERN FORMATION METHOD AND PATTERN FORMATION APPARATUS, METHOD FOR MANUFACTURING DEVICE, ELECTRO-OPTICAL DEVICE, ELECTRONIC DEVICE, AND METHOD FOR MANUFACTURING ACTIVE MATRIX SUBSTRATE

BACKGROUND OF THE INVENTION

1. Field of the Invention

Priority is claimed on Japanese Patent Application No. 2004-95976, filed Mar. 29, 2004, the content of which is incorporated herein by reference.

The present invention relates to a pattern formation method and pattern formation apparatus, to a method for manufacturing a device, to an electro-optical device, to an electronic device, which form a film pattern by disposing liquid drops of a functional liquid upon a substrate.

2. Description of Related Art

From the past, as methods of manufacturing devices which have very fine wiring patterns (film patterns), such as semiconductor integrated circuits and the like, although many photolithographic methods have been used, attention has also been paid to methods of manufacturing such devices using liquid drop ejection methods. Such liquid drop ejection methods exhibit the beneficial features that the useless consumption of functional liquid is minimized, and that it is very easy to control the amount and the position of the functional liquid which is disposed over the substrate. Techniques which are related to such liquid drop ejection methods are disclosed in Japanese Unexamined Patent Application, First Publication No. Hei 11-274671 and Japanese Unexamined Patent Application, First Publication No. 2000-216330.

However, in recent years, increase in density of the circuitry of such devices has progressed remarkably, and, although there are ongoing insistent demands for further progress in the fineness of the wiring of wiring patterns and the further miniaturization thereof, nevertheless, when attempts have been made to produce such minute wiring patterns, it has been difficult, in particular, to attain sufficient accuracy with regard to their line width. Due to this, a method has been proposed in which banks, which are partition members, are provided upon the substrate, and in which liquid drops of a functional liquid are disposed in the groove portions formed between these banks. However, when thus disposing the liquid drops in the groove portions formed between these banks, it has become apparent that sometimes it happens that the liquid drops do not sufficiently wet and spread out, in particular at the end portions of the groove portions.

On the other hand, it is possible that the provision of such banks as described above may entail an increase in cost, since they are manufactured by utilizing a photolithographic method. In this connection, a method has been proposed in which a pattern composed of liquid repelling regions and regions having an affinity with liquid is formed in advance upon the substrate, and the liquid drops are selectively positioned upon the regions having an affinity with liquid. According to this method, the liquid drops are smoothly disposed in the regions having an affinity with liquid, and can be disposed upon the substrate at high positional accuracy without forming any banks. However, with such a method in which a pattern composed of liquid repelling regions and regions having an affinity with liquid is formed in advance upon the substrate, and the liquid drops are selectively positioned upon the regions having an affinity with liquid, it has become apparent that the form and the appearance of the film pattern which is formed sometimes deviate to one side or another, due to the order of disposing of the liquid drops.

SUMMARY OF THE INVENTION

The present invention has been conceived in the light of the above described situation, and it takes as its object the provision of a pattern formation method and pattern formation apparatus, and of a method for manufacturing a device, which, when forming a film pattern such as a wiring pattern or the like by using a liquid drop ejection method, can dispose the liquid drops smoothly even at the end portions of groove portions between banks, and can thus form a film pattern having a desired pattern configuration. Furthermore, the present invention takes as its object the provision of an electro-optical device, of an electronic device, and of a method for manufacturing an active matrix substrate, which have a film pattern which has been formed in a desired pattern configuration.

Yet furthermore, the present invention takes as its object the provision of a pattern formation method and pattern formation apparatus, and of a method for manufacturing a device, which, when forming a film pattern such as a wiring pattern or the like by using a liquid drop ejection method, can form a film pattern having a desired pattern configuration. Furthermore, the present invention takes as its object to provide an electro-optical device, an electronic device, and a method for manufacturing an active matrix substrate, which have a film pattern which has been formed in a desired pattern configuration.

In order to solve the above described problems, according to its one aspect, the present invention proposes a pattern formation method for forming a film pattern upon a substrate, including the steps of: forming banks in a predetermined pattern upon the substrate; disposing liquid drops of a functional liquid at the end portions of groove portions which are defined between the banks; and after having disposed the drops at the end portions of the groove portions, disposing liquid drops in positions of the groove portions other than the end portions thereof.

According to the present invention as described above, when disposing the liquid drops in the groove portions between the banks, by arranging first to dispose the liquid drops at the end portions of the groove portions, thereby the liquid drops flow down along the side surfaces of the banks, and they come to be smoothly disposed in the corner portions between the side walls of the banks and the bottom portions of the groove portions. Accordingly, it is possible to form the film pattern in the desired pattern configuration. If it were to be arranged first to dispose the liquid drops at the central portions of the groove portions and then subsequently to dispose these liquid drops in series at end portions of the groove portions, then due to the influence of the liquid drops which were disposed first, there would be a possibility that the liquid drops which were later disposed at the end portions of the grooves might overflow out from between the banks (from the groove portions); but, by arranging first to dispose the liquid drops at the end portions of the groove portions, it is possible to prevent the liquid drops from overflowing out from between the banks (from the groove portions), even when subsequently disposing the liquid drops in series in positions in the groove portions other than their end portions.

In a desirable specialization of the present invention as described above, there may be further included the step of imparting a liquid repellency to the banks. According to this specialization of the present invention even if, when disposing the liquid drops of the functional liquid in the groove portions between the banks, some portions of the liquid drops of the functional liquid which have been ejected are disposed on the banks, nevertheless, by imparting a liquid repellency to the banks, these portions flow back down along the banks to the bottom portions of the groove portions. Accordingly, it is possible to dispose the functional liquid in an excellent and accurate manner in the groove portions between the banks. Here, as a liquid repellency-imparting step, it is possible to utilize plasma processing which employs a process gas which includes carbon tetrafluoride ($CF_4$). In this manner, by introducing into the banks, it is possible to endow them with a liquid repellency without the presence of any solvent in the functional liquid.

In another desirable specialization of the present invention as described above, there may be further included the step of imparting an affinity with liquid to the bottom portions of the groove portions. According to this specialization of the present invention, by imparting an affinity with liquid to the bottom portions of the groove portions, thereby the liquid drops of the functional liquid wet and spread out upon the bottom portions of the groove portions in an excellent manner. Here, as a liquid affinity-imparting step, it is possible to utilize plasma processing which employs a process gas which includes oxygen ($O_2$), or irradiation processing by ultraviolet light (UV).

In another desirable specialization of the present invention as described above, after having disposed the liquid drops at the end portions of the grooves, a plurality of liquid drops may be disposed in sequence along central portions of the groove portions. According to this specialization of the present invention, by disposing the liquid drops of the functional material in sequence along the groove portions, it is possible to form a linear film pattern such as a wiring pattern or the like in a desirable and satisfactory manner.

It should be understood that although, with the pattern formation method of the present invention, it is possible to form a pattern even by disposing the liquid drops of the functional material in a sequential manner, since there is a possibility of bulges occurring, it is preferable first, in a first disposing step, to dispose liquid drops of the functional material upon the substrate with certain intervals being present between them, and subsequently, in a second disposing step, to dispose other liquid drops of the functional material between each adjacent pair of the first liquid drops.

In another desirable specialization of the present invention as described above, an electrically conductive material may be included in the functional liquid. Furthermore, this functional liquid may be subjected to heat processing or processing by irradiation with light, in order to develop electrical conductivity therein. According to this specialization of the present invention, it is possible to make a wiring pattern as a very thin film pattern, so that it is possible to apply this method to a wide range of devices. Furthermore by utilizing, in addition to an electrically conductive material, a luminescent element formation material such as an organic EL or the like, or an RGB ink material, it is also possible to apply the present invention to the manufacture of a liquid crystal display device or the like which incorporates an organic EL device or a color filter.

According to another of its aspects, the present invention proposes pattern formation apparatus for forming a film pattern upon a substrate, comprising a liquid drop ejection device for disposing liquid drops of a functional liquid upon the substrate, wherein the liquid drop ejection device is adapted to: dispose liquid drops at end portions of groove portions which are defined between banks which have been formed in advance upon the substrate according to a predetermined pattern; and dispose liquid drops at positions of the groove portions other than the end portions after disposing the liquid drops at the end portions of groove.

According to the present invention as described above, it is possible smoothly to dispose the liquid drops of the functional material right up to the end portions of the groove portions between the banks, and accordingly it is possible to form a film pattern which has the desired pattern configuration.

According to another of its aspects, the present invention proposes a method for manufacturing a device, including the step for forming a film pattern upon a substrate, wherein the film pattern is formed upon the substrate according to a pattern formation method as specified by any one of the descriptions above.

According to the present invention as described above, it is possible to manufacture a device having a film pattern which is formed in a satisfactory manner right up to the end portions thereof.

According to yet another of its aspects, the present invention proposes an electro-optical device, including a device which is manufactured by a method for manufacturing a device as specified by the description above. Furthermore, according to yet another of its aspects, the present invention proposes an electronic device, including an electro-optical device as specified by the description proximately above. According to these aspects of the present invention, since the pattern is formed in a satisfactory manner all the way out to the end portions thereof, and since it is possible to obtain an advantageous film pattern with good electrical conductivity, accordingly it is possible to provide an electro optical device, and an electronic device, of excellent and indeed outstanding performance.

Furthermore, it is possible for the above electro-optical device to be, for example, a plasma display device, a liquid crystal display device, an organic electroluminescent display device, or the like.

According to yet another of its aspects, the present invention proposes a pattern formation method for forming a film pattern upon a substrate, comprising the steps of: providing a liquid repelling layer in a region which surrounds a pattern formation region upon the substrate in which a predetermined pattern is to be formed; disposing liquid drops of a functional liquid at end portions of the pattern formation region; and after having disposed the drops at the end portions, disposing liquid drops at positions of the pattern formation region other than the end portions thereof.

According to the present invention as described above, since the liquid repelling layer is provided so as to surround the pattern formation region in which the predetermined film pattern is to be formed, accordingly the liquid drops of the functional liquid which are ejected can be smoothly disposed in the pattern formation region. When thus disposing the liquid drops in the pattern formation region, by initially disposing liquid drops at the end portions of the pattern formation region, since thereby the liquid drops are smoothly disposed in these end portions of the pattern formation region, accordingly it is possible to form the desired pattern configuration in a smooth and efficient manner. Although, if after first having disposed liquid drops of the functional material at the central portion of the pattern formation region, liquid drops were to be disposed at the end portions of the pattern formation region so as to continue from these central region liquid drops, there would be a possibility that the liquid drops which were disposed at the end portions of the pattern formation region might overflow from and come out of the pattern formation region due to the influence of the liquid drops which were disposed first, on the other hand, by first disposing liquid drops at the end portions of the pattern formation region, as specified by this aspect of the present invention, it is possible to prevent the liquid drops from overflowing from and coming out of the pattern formation region, even when disposing liquid drops in positions in the pattern formation region other than the end portions thereof, so as to continue on from these initially disposed liquid drops.

In the pattern formation method of the present invention as specified above, it is possible for the liquid repelling layer to be a mono molecular film which is formed upon the surface of the substrate. It is possible for the mono molecular film to be a self assembled layer made from organic molecules. By doing this, it is possible easily to form the liquid repelling layer. For this self assembled layer, it is possible to suggest a self assembled layer made from a fluoro alkyl silane.

Furthermore, it is possible for the liquid repelling layer to be a fluoride polymer layer. Such a fluoride polymer layer may, for example, easily be made by plasma processing, using a fluorocarbon type compound as the reaction gas.

According to a particular specialization of the present invention as described above, there may be further included the step of imparting an affinity with liquid to the pattern formation region. According to this specialization of the present invention, by thus imparting an affinity with liquid to the pattern formation region, it is ensured that the liquid drops of the functional material wet and spread out well over the pattern formation region. Here it is possible to utilize, as the liquid affinity-imparting step, irradiation processing with ultraviolet light (UV). By doing this, the liquid repelling layer is destroyed over the area which is subjected to liquid affinity-imparting treatment, and it is possible to impart the desired affinity with liquid with a simple construction, simply by irradiating the relevant area with ultraviolet light. It is possible to adjust the affinity with liquid to the desired one with a simple construction, by merely adjusting the time period for this irradiation with ultraviolet light, or by adjusting the power of the ultraviolet light which is used for such irradiation.

It is also possible to impart the desired affinity with liquid by exposing the substrate to ozone at ambient pressure.

In the pattern formation method of the present invention as described above, it is possible, after having disposed the liquid drops at the end portions, a plurality of liquid drops are disposed in sequence along a central portion of the pattern formation region. By doing this, it is possible to form a desired linear pattern, such as a wiring pattern or the like, by disposing liquid drops of the functional liquid in sequence along the pattern formation region.

Moreover, according to another specialization of the present invention, it is possible, in the pattern formation method of the present invention as described above, to include, when forming the film pattern from a plurality of liquid drops: a first disposing step of disposing a plurality of liquid drops upon the substrate so as not to mutually overlap one another; and a second disposing step of disposing a plurality of liquid drops upon the substrate between the plurality of liquid drops which were disposed upon the substrate during the first disposing step. According to this specialization of the present invention, when forming a film pattern by disposing a plurality of liquid drops, after, in the first disposing step, having disposed a plurality of liquid drops upon the substrate with gaps being left between them so that they do not mutually overlap one another, subsequently, in the second disposing step, a plurality of liquid drops are disposed upon the substrate between the plurality of liquid drops which were disposed upon the substrate during the first disposing step, so as to fill up these gaps; and, accordingly, it is possible to form the desired film pattern in a continuous manner by using a plurality of liquid drops of the functional material, without allowing the occurrence of bulges. In other words, although it is easy for bulges to be generated if a plurality of liquid drops are ejected sequentially and are disposed upon the substrate so as to overlap one another at their edges, by contrast, with the above described specialization of the present invention, by separating the disposing action (the ejection action) into a plurality of phases, and disposing the liquid drops in a first disposing action with spaces between them, later filling up these spaces in a subsequent (second) disposing action with further liquid drops, it is possible to form the desired film pattern in a continuous and efficient manner by using a plurality of liquid drops of the functional material, while positively preventing any occurrence of bulges.

According to another particular specialization of the present invention, an electrically conductive material may be included in the functional liquid. Furthermore, it is possible to develop the electrical conductivity of the functional liquid by heat processing or by processing by exposure to light. According to the present invention, it is possible to manufacture an extremely thin film pattern such as a wiring pattern, and accordingly the present invention can be usefully applied to the production of a great variety of different devices. Furthermore, by utilizing, in addition to an electrically conductive material, a luminescent element formation material such as an organic EL or the like, or an RGB ink material, it is also possible to apply the present invention to the manufacture of a liquid crystal display device or the like which incorporates an organic EL device or a color filter.

According to yet another of its aspects, the present invention proposes pattern formation apparatus for forming a film pattern upon a substrate, comprising a liquid drop ejection device for disposing liquid drops of a functional liquid upon the substrate, wherein the liquid drop ejection device is adapted to: dispose liquid drops at end portions of a pattern formation region upon the substrate in which a predetermined pattern is to be formed and around which a liquid repelling layer has been provided in advance; and dispose liquid drops at positions of the pattern formation region other than the end portions after disposing the liquid drops at the end portions of the pattern formation region.

According to the present invention as described above, it is possible to dispose the liquid drops of the functional material smoothly all the way up to the end portions of the pattern formation region, so that it is possible to build up a film pattern having the desired pattern configuration efficiently and accurately.

According to yet another of its aspects, the present invention proposes a method for manufacturing a device, including the step of forming a film pattern upon a substrate, wherein the film pattern is formed upon the substrate using a pattern formation method as described above.

According to the present invention as described above, it is possible to manufacture a device having a film pattern which is formed in an appropriate manner, as desired, all the way up to, and including, the end portions thereof.

Moreover, according to yet another of its aspects, the present invention proposes an electro-optical device, including a device which is manufactured using a method as described proximately above. Furthermore, according to yet another of its aspects, the present invention proposes an electronic device, including an electro-optical device as described immediately above. According to these particular aspects of the present invention, it is possible to provide an electro-optical device and an electronic device which have outstandingly excellent performance, since it is possible to provide an efficient film pattern which is electrically conductive and is properly built up, all the way to the end portions thereof.

Such an electro-optical device may be, for example, a plasma display device, a liquid crystal display device, an organic electroluminescent device, or the like.

According to yet another of its aspects, the present invention proposes a method for manufacturing an active matrix substrate, including: a first step of forming a gate lead line upon a substrate; a second step of forming a gate insulation layer over the gate lead line; a third step of forming a semiconductor layer over the gate insulation layer; a fourth step of forming a source electrode and a drain electrode over the gate insulation layer; a fifth step of disposing an insulation material over the source electrode and the drain electrode; and a sixth step of forming a pixel electrode which is electrically connected to the drain electrode; wherein at least one of the first step, the fourth step, and the sixth step includes: forming banks corresponding to a predetermined pattern upon the substrate; disposing liquid drops at end portions of groove portions which are defined between the banks; and a step of, after having disposed the liquid drops at the end portions of the groove portions, disposing liquid drops in positions of the groove portions other than the end portions thereof.

According to the present invention as described above, it is possible to dispose the liquid drops of the functional material smoothly even at the end portions of the groove portions between the banks, and, since it is possible to form a film pattern in the desired pattern configuration, accordingly it is possible to manufacture an active matrix substrate which can provide the desired performance.

According to yet another of its aspects, the present invention proposes a method for manufacturing an active matrix substrate, including: a first step of forming a gate lead line upon a substrate; a second step of forming a gate insulation layer over the gate lead line; a third step of forming a semiconductor layer over the gate insulation layer; a fourth step of forming a source electrode and a drain electrode over the gate insulation layer; a fifth step of disposing an insulation material over the source electrode and the drain electrode; and a sixth step of forming a pixel electrode which is electrically connected to the drain electrode; wherein at least one of the first step, the fourth step, and the sixth step includes: providing a liquid repelling layer in a region which surrounds a pattern formation region which has been set upon the substrate and in which a predetermined pattern is to be formed; and disposing liquid drops at end portions of the pattern formation region; and a step of, after having disposed the liquid drops at the end portions of the pattern formation region, disposing liquid drops in positions of the pattern formation region other than the end portions thereof.

According to the present invention as described above, since it is possible to form a film pattern in the desired pattern configuration, accordingly it is possible to manufacture an active matrix substrate which can provide the desired performance.

As an ejection method for the above described liquid drop ejection device (ink jet device), it is possible to suggest an electrification control method, a pressure vibration method, an electromechanical conversion method, an electro-thermal conversion method, a static electricity expulsion method, or the like. An electrification control method is one in which an electric charge is imported to the material by a charging electrode, and the material (the functional liquid) is ejected from the ejection nozzle while its direction of emission is controlled by a deflection electrode. Furthermore, a pressure vibration control method is one in which a very high pressure of about 30 kg/cm$^2$ is applied to the material so that it is ejected from the tip of the nozzle, so that, if no control voltage is applied, the material is ejected from the nozzle in a straight line, while if a control voltage is applied, electrostatic repulsion is engendered between the various portions of the material, so that the material is scattered and is not ejected in a straight line from the nozzle. Yet furthermore, an electromechanical conversion control method is one which takes advantage of the characteristic that a piezo element (a piezo-electric element) deforms when it is subjected to a pulse type electrical signal, by applying a pressure by such a deformation of a piezo element, via a flexible member, to a space in which the material (the functional liquid) is stored, so that material is pushed out from this space to be ejected from the ejection nozzle. Even furthermore, an electro-thermal conversion method is one in which the material is heated up by a heater provided within a space in which it is stored, and is abruptly vaporized so that bubbles are generated therein, and then the material within this space is ejected therefrom due to the pressure of the bubbles. Finally, a static electricity expulsion method is one in which a very small pressure is applied to the material within the space in which it is stored, so that a meniscus is created upon the material at an ejection nozzle, and then, in this state, the material is ejected by subjecting it to static electrical attraction. Furthermore, in addition to these, it is also possible to apply techniques such as a method which takes advantage of the change of viscosity of a liquid due to an electric field, or a method in which the liquid is caused to be ejected by an electric spark discharge, or the like. These liquid drop ejection methods do not waste any material; rather, they have the advantageous feature that they can dispose an appropriate and desired amount of liquid material in the desired position. It should be understood that the amount of the functional liquid (i.e., of liquid material) in a single drop of the functional liquid which is ejected by any one of these liquid drop ejection methods is, for example, from 1 to 300 nanograms.

The liquid material in which the functional liquid is included is a medium which has an appropriate viscosity for being ejected from the ejection nozzle or nozzles of the liquid drop ejection head. It may be water-based or oil-based. It will be acceptable to use any such medium, including one in which a solid substance is dispersed, provided that it is one which, overall, has a suitable viscosity for being ejected from the nozzle or the like. Furthermore, the material which is included in the liquid material, in addition to being one which is dispersed within the solvent as minute particles, may also be one which is dissolved by being heated up to above its melting point, and, in addition to the solvent, there may also be included another functional material, such as a dye or a pigment. Yet furthermore, in addition to the substrate being a flat substrate, it may also be a substrate of curved form. Finally, it is not necessary for the surface upon which the pattern is to be formed to be a hard surface; in addition to being a hard surface such as one made from glass, plastic, metal, or the like, it could also be a surface having a certain degree of flexibility, such as one made from a film, paper, rubber, or the like.

DETAILED DESCRIPTION OF THE INVENTION

First Preferred Embodiment

Pattern Formation Method

Figure 1:
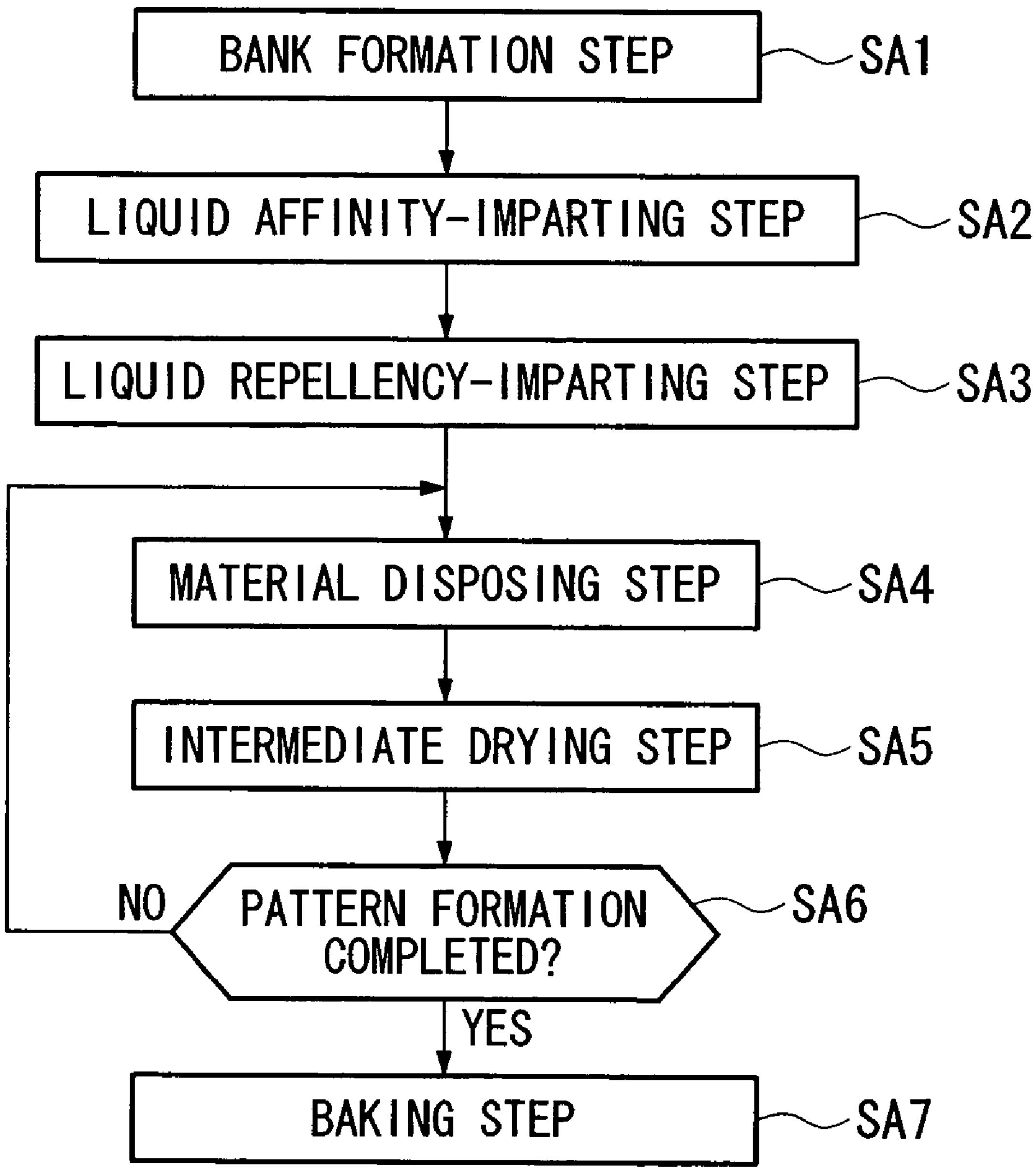
FIG. 1 is a flow chart showing one embodiment of the pattern formation method of the present invention.

In the following, a first preferred embodiment of the pattern formation method according to the present invention will be explained with reference to the drawings. FIG. 1 is a flow chart showing the first preferred embodiment of the pattern formation method according to the present invention.

Here, for this first preferred embodiment of the present invention, an example will be explained in which an electrically conductive film wiring pattern is formed upon a glass substrate. Furthermore, as the functional liquid for making this electrically conductive film wiring pattern, there is used an organic silver compound dissolved in diethylene glycol diethyl ether solvent (a dispersion medium).

Referring to FIG. 1, the pattern formation method according to this first preferred embodiment of the present invention includes: a bank formation step in which liquid drops of a functional liquid are disposed upon the substrate so as to form banks which correspond to a wiring pattern (a step SA1); a liquid affinity-imparting step in which an affinity with liquid is imparted to the bottom portions of the groove portions between these banks formed between these banks (a step SA2); a liquid repellency-imparting step in which a liquid repellency is imparted to the banks (a step SA3); a material disposing step in which liquid drops of the functional liquid are disposed in the groove portions between the banks, based upon a liquid drop ejection method, so as to build up (i.e., to form) a film pattern (a step SA4); an intermediate drying step, including heat processing or processing by irradiation with light, in which at least a portion of the liquid component of the functional liquid which has been disposed upon the substrate is removed (a step SA5); and a baking step in which the substrate, with the predetermined film pattern formed upon it, is fired (a step SA7). It should be understood that, after the intermediate drying step, a decision is made as to whether or not the drawing of the predetermined pattern has been completed (a step SA6), and, if the step of pattern drawing has been completed, the baking step is performed, while on the other hand, if the step of pattern drawing has not been completed, another episode of the material disposing step is performed.

In the following, each of these processes will be explained in detail.

Bank Formation Process

Figure 2A:
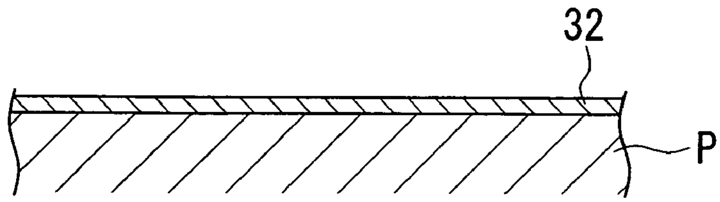
FIGS. 2A–2D are schematic diagrams showing an exemplary process for formation of a pattern according to the present invention.
Figure 2B:
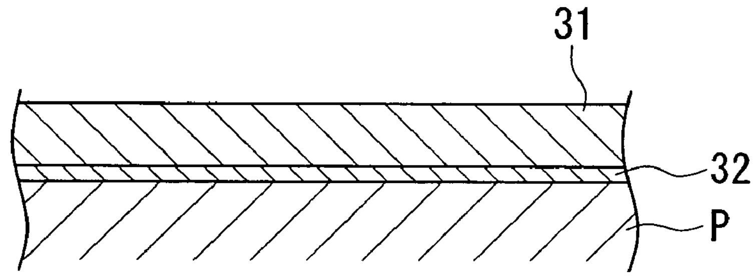
Figure 2C:
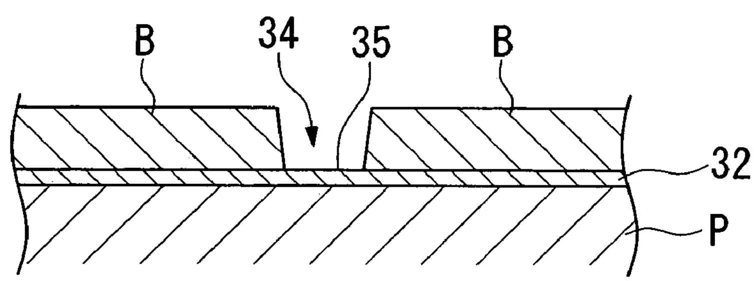

First, as shown in FIG. 2A, as a surface modification, an HMDS treatment is performed upon the substrate P. In such an HMDS treatment, hexamethyldisilazane ($(CH_3)_3SiNHSi(CH_3)_3$) is vaporized and is applied to the surface of the substrate. By doing this, an HMDS layer 32 is formed upon the substrate P, thus acting as an adhesion promotion layer which enhances the adhesion between the banks and the substrate P. The banks functions as partition members, and the formation of these banks may be performed using any suitable method, such as a photolithographic method or a printing method or the like. For example, if a photolithographic method is to be utilized, a organic material 31, which is the material to be utilized for forming the banks, is painted by a predetermined method such as spin coating, spray coating, roll coating, dye coating, dip coating, or the like, as shown in FIG. 2B, over the HDMS layer 32 upon the substrate P to a height which corresponds to the desired height of the banks, and a resist layer is formed over that layer. Masking is performed in correspondence to the desired pattern of banks (the wiring pattern), and then, by exposing and developing the resist, a pattern of resist which corresponds to the desired pattern for the banks is left remaining. Finally the organic material 31 are removed by etching, except for regions which are covered by the resist layer. Moreover, it would also be acceptable to form two or more layers of banks by making the lower layer from an inorganic material and the upper layer from an organic material. By doing this, as shown in FIG. 2C, banks B and B are formed over the substrate, so as to surround the peripheries of the regions in which the wiring pattern is to be formed. As the organic material from which the banks are to be formed, it is preferable to utilize a material which exhibits a liquid repellency with respect to the functional liquid (the liquid material), and, as will be explained hereinafter, it is preferable to utilize an insulating organic material which can be made liquid repelling by plasma processing, which has good adhesion to the underlying substrate, and which can be easily patterned by photolithography. For example, it is possible to utilize a high molecular weight material such as acrylic resin, polyimide resin, olefin resin, phenol resin, melamine resin, or the like.

Figure 2D:
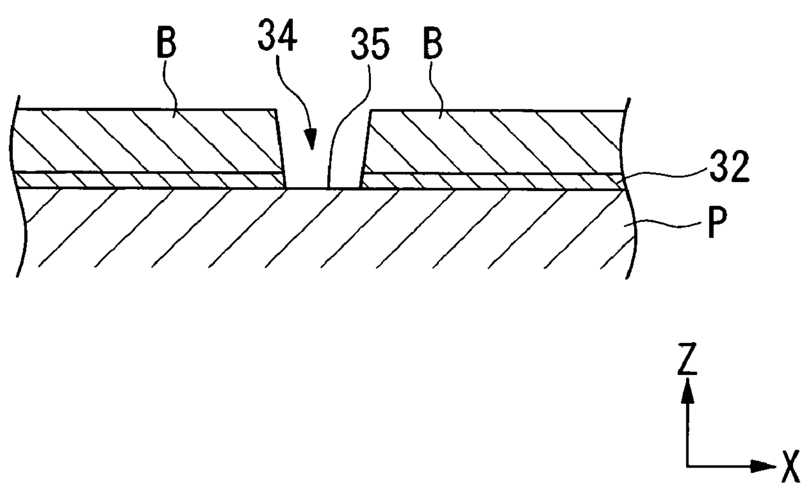
Figure 3A:
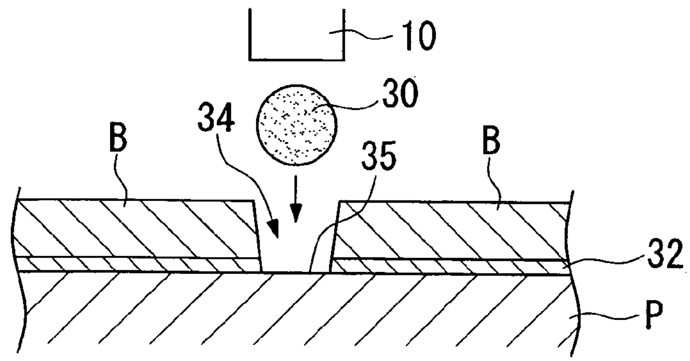
FIGS. 3A–3D are schematic diagrams showing an exemplary process for formation of a pattern according to the present invention.
Figure 3B:
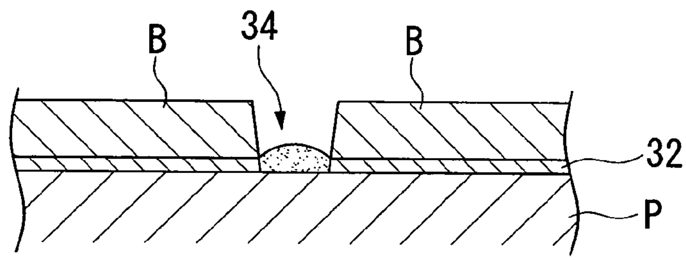
Figure 3C:
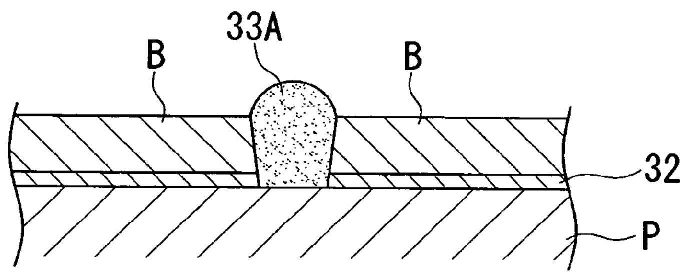
Figure 3D:
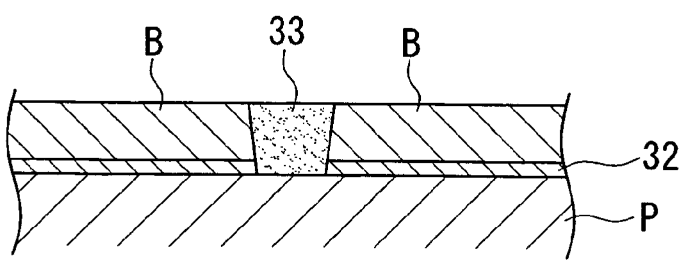
Figure 3D:
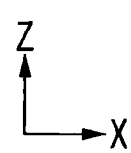

When forming the banks B and B upon the substrate P, treatment with hydrofluoric acid is performed. In such a hydrofluoric acid treatment, the HDMS layer 32 between the banks B and B is removed by performing etching with, for example, a 2.5% aqueous hydrofluoric acid solution. With such hydrofluoric acid treatment, the banks B and B function as masks, and any remaining portions of the organic HDMS layer 32 which resides at the bottom portions of the groove portions 34 defined between the banks B and B are removed. Thus, as shown in FIG. 2D, by doing this, the residual HDMS is removed.

Liquid Affinity-Imparting Step

Next, a liquid affinity-imparting step is performed to impart an affinity with liquid to the bottom portions 35 of the groove portions 34. As such a liquid affinity-imparting step, it is possible to select ultraviolet light (UV) irradiation processing in which an affinity with liquid is imparted by irradiation with ultraviolet light, or $O_2$ plasma processing or the like, in which oxygen in the air is used as the process gas in the atmosphere at ambient pressure. Here, $O_2$ plasma processing is employed.

In such $O_2$ plasma processing, oxygen in the plasma state is irradiated from a plasma discharge electrode against the substrate. As one example of conditions of such $O_2$ plasma processing, for example, the plasma power may be 50 to 1000 W, the flow rate of the oxygen gas may be from 50 to 100 mL/min, the relative shifting speed of the substrate with respect to the plasma discharge electrode may be 0.5 to 10 mm/sec, and the temperature of the substrate may be 70 to 90° C. If the substrate is a glass substrate, although its surface is in any case endowed with some affinity with liquid with respect to the functional liquid, it is possible to enhance the affinity with liquid of the P surface of the substrate which is exposed between the banks B and B (i.e., of the bottom portions 35) by subjecting it to $O_2$ plasma processing or ultraviolet light irradiation processing, as in this preferred embodiment of the present invention. Thus, it is preferable to perform $O_2$ plasma processing or ultraviolet light irradiation processing, so that the contact angle of the bottom portions 35 between the banks B and B with respect to the functional liquid may become less than or equal to 15°.

It should be understood that this $O_2$ plasma processing or ultraviolet light irradiation processing removes the HMDS included in the residue which remains at the bottom portions 35. Due to this, even if it should occur that the organic material residue (HMDS) has not been entirely removed from the bottom portions 35 between the banks B and B by the hydrofluoric acid treatment as described above, it is possible to remove this residue by performing $O_2$ plasma processing or ultraviolet light irradiation processing. Moreover it should be understood that, in this procedure, although the hydrofluoric acid treatment has been described above as being performed as one aspect of treating this residue, as an alternative, it would also be acceptable not to perform such hydrofluoric acid treatment at all since it would be possible sufficiently to remove the residue at the bottom portions 35 between the banks B and B by the $O_2$ plasma processing or the ultraviolet light irradiation processing. Furthermore, although in the above description, for this residue treatment, the use of $O_2$ plasma processing and of ultraviolet light irradiation processing have been described as alternatives, of course it would also be acceptable to perform a combination both of $O_2$ plasma processing and of ultraviolet light irradiation processing.

Liquid Repellency-Imparting Step

Next, a liquid repellency-imparting step is performed upon the banks B to impart a liquid repellency to their surfaces. As such a liquid repellency-imparting step, it is possible to utilize a plasma processing method (a $CF_4$ plasma processing method) in which carbon tetrafluoride (tetrafluoromethane) is employed as the process gas at ambient atmospheric pressure. As one example of conditions under which such $CF_4$ plasma processing may be performed, for example, the plasma power may be 50 to 1000 W, the flow rate of the carbon tetrafluoride gas may be from 50 to 100 mL/min, the relative shifting speed of the substrate with respect to the plasma discharge electrode may be 0.5 to 1020 mm/sec, and the temperature of the substrate may be 70 to 90° C. It should be understood that the process gas should not be considered as being limited to carbon tetrafluoride; alternatively, it would be possible to utilize some other fluorocarbon gas. By performing this type of liquid repellency-imparting step, fluorine-containing groups are introduced into the resin which constitutes the banks B and B, and thereby a high liquid repellency is not substantially compromised. It should be understood that, although it would be acceptable to perform the $O_2$ plasma processing which serves as the above described liquid affinity-imparting treatment before forming the banks B, it is more preferable to perform the $O_2$ plasma processing after forming the banks B, since acrylic resin or polyimide resin or the like is a material which, if pre-processing by $O_2$ plasma is performed, can easily be made liquid repelling (can be easily fluorinated).

It should be understood that, the liquid repellency-imparting treatment to which the banks B and B are subjected may more or less affects the exposed portions of the substrate P between the banks B and B which have previously been subjected to liquid affinity-imparting treatment, in particular if the substrate P is glass or the like, since introduction of fluorine-containing groups caused by the liquid repellency-imparting treatment is absent, in actual practice, no damage is entailed to the affinity with liquid of the substrate P, in other words to its wettability. Furthermore, with regard to the banks B and B, it would also be acceptable to curtail the liquid repellency-imparting treatment thereof by making the banks B and B from a material which has a liquid repellency (for example a material which contains fluorine groups).

Material Disposing Step

Next, the material disposing step that is included in the method according to this first preferred embodiment of the present invention will be explained with reference to FIGS. 3A–3D and 4A–4D. This material disposing step is a step of building up a film pattern (a wiring pattern) in the form of lines upon the substrate P by disposing liquid drops of a functional liquid, including material for forming the wiring pattern, in the groove portions 34 between the banks B and B by ejecting them from a liquid drop ejection head 10 of a liquid drop ejection device, and includes a first step in which liquid drops are disposed at the end portions of the groove portions 34 between the banks B and B, and a second step in which, after having disposed these liquid drops at the end portions, liquid drops are disposed at positions of the groove portions 34 other than their end portions. In this first preferred embodiment of the present invention, the functional liquid, which is the liquid for forming the wiring pattern, is a liquid in which an organic silver compound containing silver is dispersed in diethylene glycol diethyl ether.

Figures 4A, 4B, 4C, 4D:
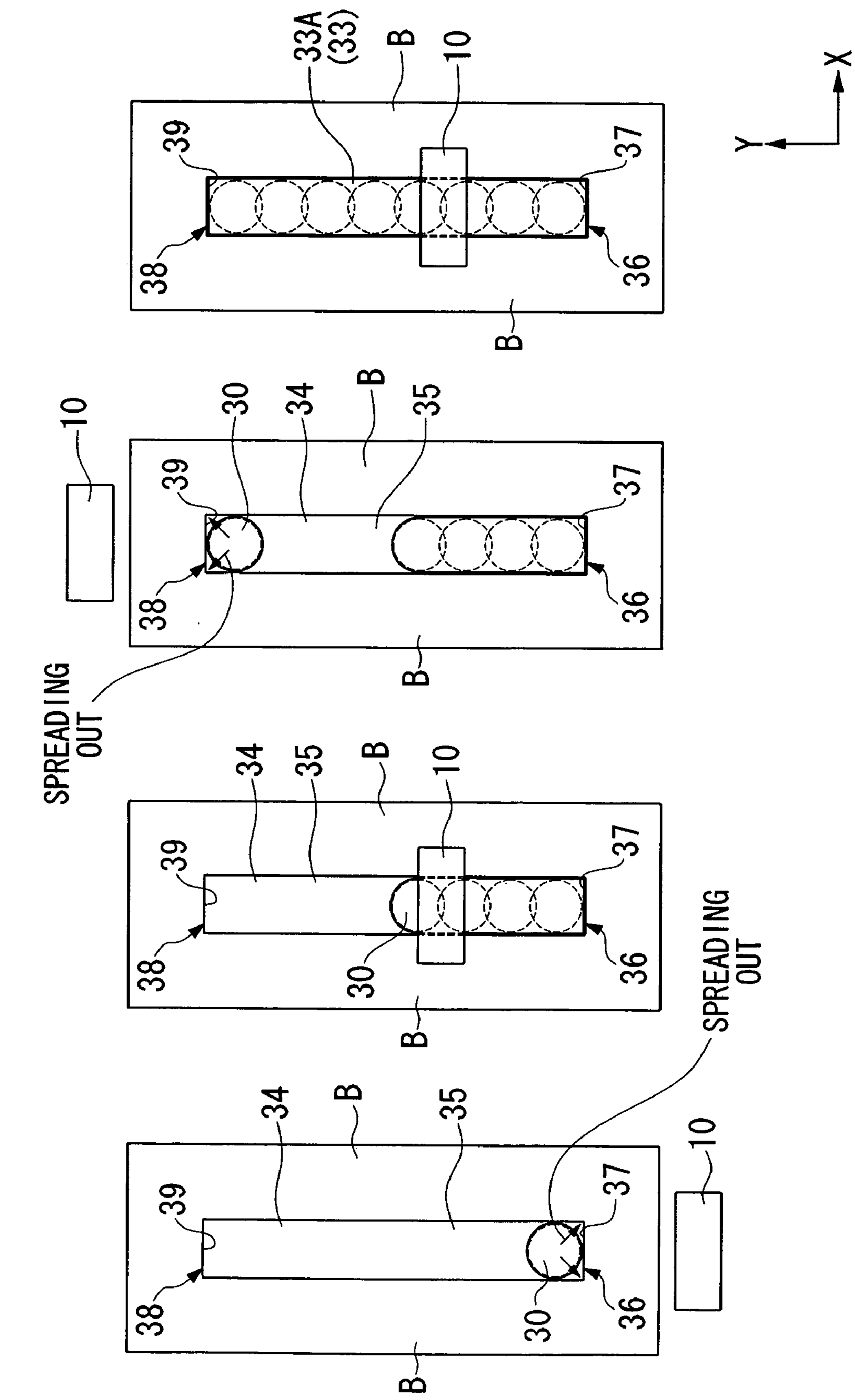
FIGS. 4A–4D are schematic diagram showing an exemplary process for formation of a pattern according to the present invention.

In the above mentioned first step of this material disposing step, as shown in plan view in FIG. 4A, a liquid drop 30 which is ejected from the liquid drop ejection head 10 is disposed at one of the end portions 36 in the longitudinal direction of the groove portion 34 between the banks B and B (the lower end portion thereof in the figure). Here, the groove portion 34 is, in plan view, shaped as a rectangle whose longitudinal direction extends along the Y axis direction in the figure, and, at its end portion 36, a corner portion 37 (angled portion) is defined between its bottom portion 35 and the wall surfaces of the banks B. The liquid drop which has been ejected against the end portion 36 flows downward following the wall surfaces of the banks B, and smoothly comes to be positioned at this corner portion 37 between the bottom portion 35 of the groove portion 34 and the banks B. Here, since a liquid repellency has been imparted to the banks B, even if a portion of this liquid drop 30 which has thus been ejected should be disposed on one of the banks B, it is repelled from this bank B, and again flows downward following the wall surface of this bank B to the bottom portion 35 of the groove portion 34. Since the bottom portion 35 of the groove portion 34 has been endowed with an affinity with liquid, the liquid drop 30 which has flowed down to this bottom portion 35 wets it well and spreads out in a satisfactory manner.

When the liquid drop has been thus disposed at this end portion 36 in the longitudinal direction of the groove portion 34, as shown in FIG. 4B, a plurality of further liquid drops are ejected in succession from the liquid drop ejection head 10, while relatively shifting the liquid drop ejection head 10 along the Y axis direction with respect to the substrate P (in the upward direction in the figure). These liquid drops which are ejected from the liquid drop ejection head 10 are disposed in sequence along the main body of the groove portion 34 (i.e., along its portion other than its end portions 36 and 38). In FIG. 4B, an example is shown in which, after having disposed a liquid drop at one end portion 36 of the groove 34, a plurality of liquid drops are disposed in order along the central portion of the groove portion 34 along its longitudinal direction. By doing this, a portion of the wiring pattern is formed in a satisfactory manner.

At this time, since the region against which the liquid drops are ejected and in which the wiring pattern should be formed (in other words, the groove portion 34) is surrounded by the banks B and B, accordingly it is possible to prevent the liquid drops from spreading out to any regions other than their predetermined positions. Furthermore, since a liquid repellency has been imparted to the banks B and B, even if some portion of one of these liquid drops 30 which has thus been ejected should be disposed on one of the banks B, it is repelled from this bank B due to the liquid repellency which has been imparted to this bank B, and again flows downward following the wall surface of this bank B to the bottom portion 35 of the groove portion 34. Since the bottom portion 35 of the groove portion 34 at which the substrate P is exposed has been endowed with an affinity with liquid, the liquid drops 30 which have been ejected and have flowed down to this bottom portion 35 wet it well and spread out in a satisfactory manner, so that thereby the functional liquid comes to be disposed evenly in its predetermined position.

It should be understood that although, in the example shown in FIG. 4B, the structure is such that, when the next liquid drop is ejected after a previous liquid drop has been disposed upon the substrate P, the next liquid drop is ejected so that a portion thereof overlaps a portion of the previous liquid drop as it is disposed upon the substrate P. According to requirements, between the time point at which the previous liquid drop has been disposed upon the substrate P and the time point at which the next liquid drop is ejected, an intermediate drying step (a step A5) may be performed in order to remove the liquid component (i.e., of the dispersion medium) in the previous liquid drop which has already been disposed upon the substrate P. Such an intermediate drying step, in addition to being a conventional heat treatment which is performed by using a heating device such as, for example, a hot plate, an electric furnace, a hot air dryer, or the like, may also be a processing by irradiation with light using lamp annealing.

Next, as shown in FIG. 4C, the liquid drop ejection head 10 is shifted to the other one 38 of the end portions in the longitudinal direction of the groove portion 34 (the uppermost end portion thereof in the figure). A liquid drop 30 is ejected from the liquid drop ejection head 10 against this end portion 38. This liquid drop which has been ejected against the end portion 38 flows down along the wall surface of the bank B, and smoothly comes to be disposed at the corner portion 39 between the banks B and the bottom portion 35 of the groove portion 34. Here, since a liquid repellency has been imparted to the banks B, this liquid drop slips downwards to the bottom portion 35 of the groove portion 34 along the wall surfaces of the bank B in a smooth and sure manner. Since the bottom portion 35 of the groove portion 34 has been imparted an affinity with liquid, this liquid drop, when it has flowed down to this bottom portion 35, wets it well and spreads out over it in an efficient and reliable manner.

When the liquid drop has thus been disposed at the end portion 38 in the longitudinal direction of the groove portion 34, as shown in FIG. 4D, the liquid drop ejection head 10 is shifted with respect to the substrate P along the Y axis direction, while ejecting a plurality of liquid drops in succession. This plurality of liquid drops thus comes to be disposed in order along the center in the longitudinal direction of the groove portion 34 while connecting with the portion of the wiring pattern which has already been formed, and thereby the wiring pattern (the film pattern) 33A is formed.

It should be understood that, as the conditions under which the liquid drops are ejected, for example, it is possible to employ a weight of the ink of about 4 ng/dot, and an ink speed (ink ejection speed) of 5 to 7 m/sec. Furthermore, it is preferable to arrange to set the ambient atmosphere into which the liquid drops are ejected to be at a temperature of less than or equal to 60° C. and a humidity of less than or equal to 80%. By doing this, it is possible for the ejection nozzle of the liquid drop ejection head 10 to eject of the liquid drops in a stable manner without any clogging.

Intermediate Drying Step

After a liquid drop has thus been ejected against the substrate P, according to requirements, a drying step is performed in order to remove the dispersion medium in the liquid drop, and in order to ensure that a thin layer of desired thickness is formed. Such a drying step may be performed by, for example, a conventional method of heating up the substrate P with a hot plate, an electric furnace, a hot air dryer, or the like; or alternatively lamp annealing may also be employed. The light source which is used for such lamp annealing is not to be considered as being particularly limited, but it may be an infrared lamp, a xenon lamp, a YAG laser, an argon laser, a carbon dioxide gas laser, or an excimer laser such as a XeF, XeCl, XeBr, KrF, KrCl, ArF, or ArCl laser or the like. These light sources are generally utilized in the output power range from 10 W to 5000 W, but, in this first preferred embodiment of the present invention, an output power of from 100 W to 1000 W is considered to be sufficient. By repeating this intermediate drying step and the above described material disposing step, a plurality of layers of liquid drops of the functional liquid are built up in superimposition, and thereby a thick wiring pattern (film pattern) 33A is formed.

Baking Step

After the drop ejection step, a drying step is required for completely removing the dispersion medium, in order to ensure good electrical contact between the minute particles. Furthermore, if a coating material such as an organic material or the like has been coated on the surface of the electrically conductive minute particles in order to enhance the dispersibility, it is also necessary to remove this coating material. Yet further, if an organic silver compound is included in the functional liquid, it is necessary to perform heat treatment in order to obtain electrical conductivity, and to remove the organic component in the organic silver compound so as to leave silver particles remaining. For this, heat processing and/or processing by light is performed after the ejection step. Such heat processing and/or processing by light is normally performed in the ambient atmosphere, but, according to requirements, it could be performed in an inactive gas atmosphere, such as nitrogen, argon, helium or the like. The processing temperature for this heat processing and/or processing by light is set suitably, in consideration of the boiling point (the vapor pressure) of the dispersion medium, the type and pressure of the gas atmosphere, the thermal behavior of the minute particles such as their dispersibility and oxidizability and so on, the presence or absence of any coating material and the amount thereof, the heat resistant temperature of the substrate itself, and so on. For example, in order to remove a coating material which consists of an organic material, it is necessary to perform baking at about 300° C. Furthermore, in order to remove, for example, the organic component of an organic silver compound, it is necessary to perform baking at about 200° C. Yet further, if a substrate made of plastic or the like is utilized, it is preferable to perform baking above room temperature but at less than or equal to 100° C. The electrical contact between the minute particles in the electrically conductive material (the organic silver compound) after the ejection step is ensured by the above described process, and, it is converted into an electrically conductive layer 33 (i.e., a wiring pattern).

It should be understood that, after the baking step, it is possible to remove the banks B and B which are present upon the substrate P by ashing stripping processing. Such ashing processing can utilize plasma ashing or ozone ashing or the like. In plasma ashing, gas such as oxygen gas or the like is plasmatized and reacts with the banks, and the banks are vaporized and striped/removed from by converting them into gas. The banks are made from a solid material which consists of carbon, oxygen, and hydrogen, and this is converted into $CO_2$, $H_2O$, and $O_2$ by chemical reaction with the oxygen plasma, so that it can be completely striped by being converted into gaseous form. On the other hand, the basic theory of ozone ashing is the same as that of plasma ashing: $O_3$ (ozone) is dissociated into O (oxygen radical) which is a reactive gas, and this O reacts with the material of the banks. The banks which have reacted with the O are converted into $CO_2$, $H_2O$, and $O_2$, and are entirely striped by being converted into gaseous form. The banks are removed from the substrate P by the ashing stripping processing being performed upon the substrate P.

Next, an example of another liquid drop disposing step when forming a wiring pattern 33 will be explained with reference to FIGS. 5A–5C.

Figure 5A:
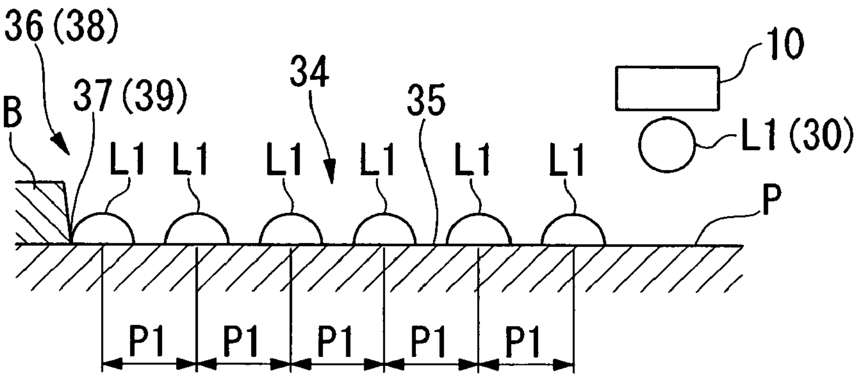
FIGS. 5A–5C are schematic diagrams showing an exemplary process for formation of a pattern according to the present invention.

First, as shown in FIG. 5A, liquid drops L1 which have been ejected from the liquid drop ejection head 10 are disposed in order upon the substrate P with predetermined intervals between them. In other words, the liquid drop ejection head 10 is positioned over the substrate P so that the liquid drops L do not overlap one another (in a first disposing step). In this example, the disposition pitch P1 at which the liquid drops L1 are disposed is set so as to be greater than the diameter of the liquid drops L1 immediately after they have been disposed upon the substrate P. By doing this, immediately after the liquid drops L1 have been disposed upon the substrate P, they do not overlap one another (do not touch one another), so that the liquid drops L1 are prevented from wetting and spreading out upon the substrate P and coalescing with one another. Furthermore, the pitch P1 at which the liquid drops L1 are disposed is set so as to be less than or equal to twice the diameter of the liquid drops L1 immediately after they have been disposed upon the substrate P. Here, according to requirements, after the liquid drops L1 have been disposed upon the substrate P, it is possible to perform an intermediate drying step (the step SA5), in order to remove the dispersion medium.

Figure 5B:
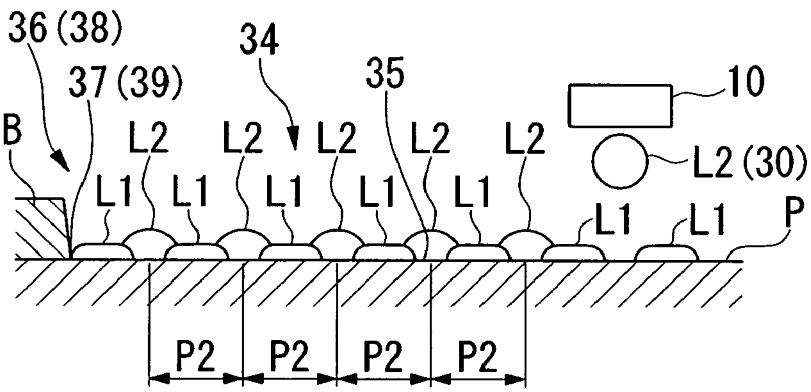

Next, as shown in FIG. 5B, the disposition of liquid drops described above is repeated. In other words, in the same manner shown in FIG. 5A, the functional liquid is ejected from the liquid drop ejection head 10 as liquid drops L2, and these liquid drops L2 are disposed upon the substrate P at a fixed distance apart from one another. At this time, the volume of the liquid drops L2 (the amount of functional liquid per each single such liquid drop L2), and the pitch at which these liquid drops L2 are disposed upon the substrate P, are the same as for the liquid drops L1 during the previous disposing step described above. The positions on which the liquid drops L2 are disposed are shifted by just ½ of this pitch from the positions in which the liquid drops L1 were disposed during the previous disposing step, so that these liquid drops L2 which are disposed during this episode (the second disposing step) are disposed in positions at the center between adjoining ones of the liquid drops L1 which were disposed upon the substrate P during the previous disposing step. As has been explained above, the disposition pitch P1 at which the liquid drops L1 are disposed upon the substrate P is set to be greater than the diameter of these liquid drops L1 immediately after they have thus been disposed upon the substrate P, while being less than or equal to twice that diameter. Because of this, portions of the liquid drops L1 and the liquid drops L2 are overlapped by disposing the liquid drops L2 in positions at the center between the liquid drops L1, and the gaps between adjacent ones of the liquid drops L1 are filled up by the liquid drops L2. At this time, although the liquid drops L2 which are disposed in this disposing step come into contact with and overlap the liquid drops L1 which have been disposed during the previous disposing step, very little coalescence of the liquid drops L1 and L2 and spreading out of the coalesced mass thereof occurs, since the dispersion medium which was present in the liquid drops L1 which have been disposed during the previous disposing step has by now completely or at least mostly been removed. After the liquid drops L2 have been disposed upon the substrate P, it is possible to perform the intermediate drying step described above, according to requirements, in order to remove the dispersion medium in the liquid drops L2, in the same way as was described above for eliminating the dispersion medium in the liquid drops L1.

Figure 5C:
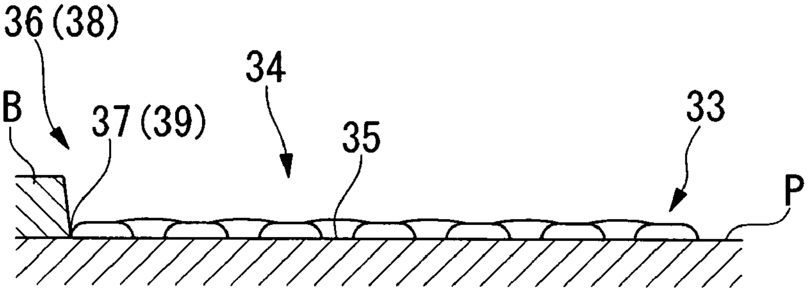

By repeating such a disposing step of liquid drops a plurality of times, the gaps between the adjacent liquid drops which are disposed upon the substrate P are filled up, and, as shown in FIG. 5C, a wiring pattern 33 consisting of continuous wiring in the desired pattern is built up on the substrate P. In this case, it is possible to increase the thickness of the wiring pattern 33 by increasing the number of times of repetition of the disposition of liquid drops, thus disposing liquid drops in succession upon the substrate P so that they overlap one another.

It should be understood that although, in FIG. 5B, the position at which the disposition of the liquid drops L2 starts is the same side as in the previous disposing step (i.e., the left side as shown in FIG. 5A), it would also be acceptable for it to be on the opposite side (i.e., the right side). By performing the ejection of the liquid drops while shifting the liquid drop ejection head in a to-and-fro motion, it is possible to reduce the distance through which the liquid drop ejection head 10 and the substrate P must be shifted relative to one another.

Next, another example of the pattern for disposing the liquid drops of the functional liquid will be explained with reference to FIGS. 6 and 7. Here, in the explanation using FIGS. 6 and 7, the reference numeral 1 is used to denote that liquid drop which has first been disposed upon the substrate P (in the groove portion 34), while the reference numerals 2, 3, . . . are used to denote the liquid drops which have been subsequently disposed, in that order.

Figure 6:
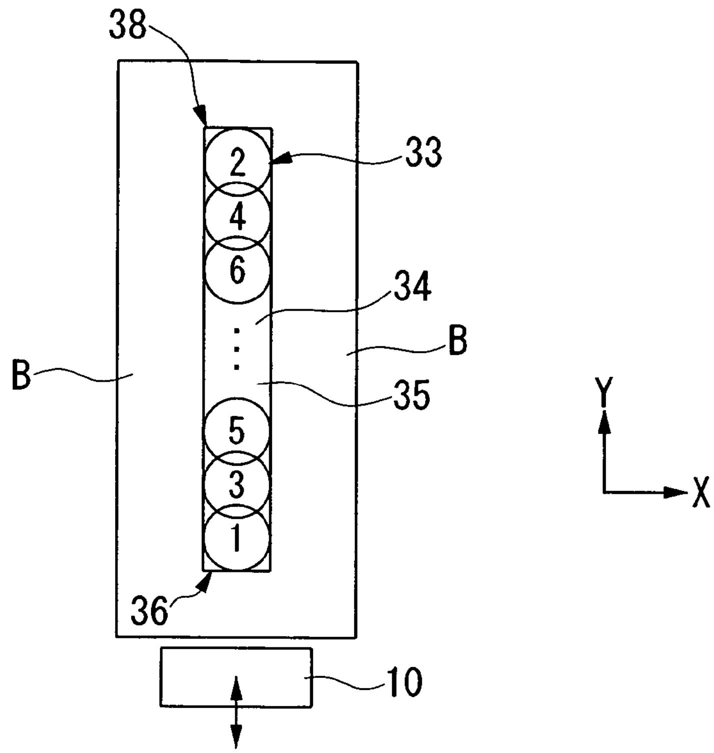
FIG. 6 is a schematic diagram showing an exemplary process for formation of a pattern according to the present invention.

As shown in FIG. 6, it is possible to arrange to dispose a first liquid drop 1 at one end portion 36 of the groove portion 34 in its one longitudinal direction, and next a second liquid drop 2 is disposed at the other end portion 38 of the groove portion 34 in its other longitudinal direction; and, thereafter, the other liquid drops are disposed in order towards the center of the groove portion 34, with the odd numbered drops adjacent to one another in order from the one end portion 36, and the even numbered drops adjacent to one another in order from the other end portion 38.

Figure 7:
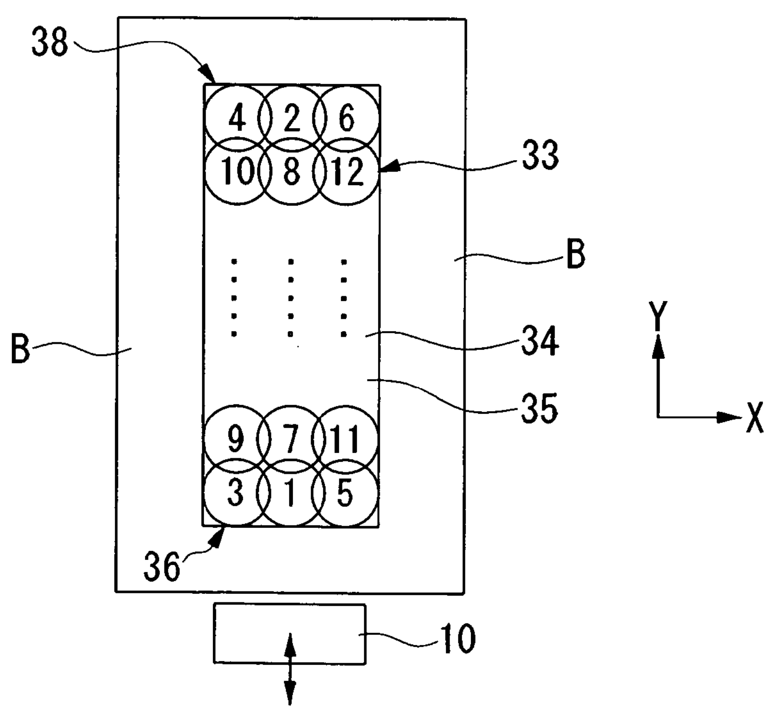
FIG. 7 is a schematic diagram showing an exemplary process for formation of a pattern according to the present invention.

Furthermore, as shown in FIG. 7, when forming a wiring pattern 33 which is relatively wide and which is formed by combining a plurality of linear patterns (in this case, of three such patterns) side by side, it would also be acceptable to arrange the pattern so as to dispose these liquid drops alternately at each end 36 and 38 of the groove portion 34, as above, but side by side in the appropriate plurality (in this case, with three consecutive odd numbered drops side by side and three consecutive even numbered drop side by side), before continuing to the next stage towards the central portion of the groove portion 34.

Figure 8C:
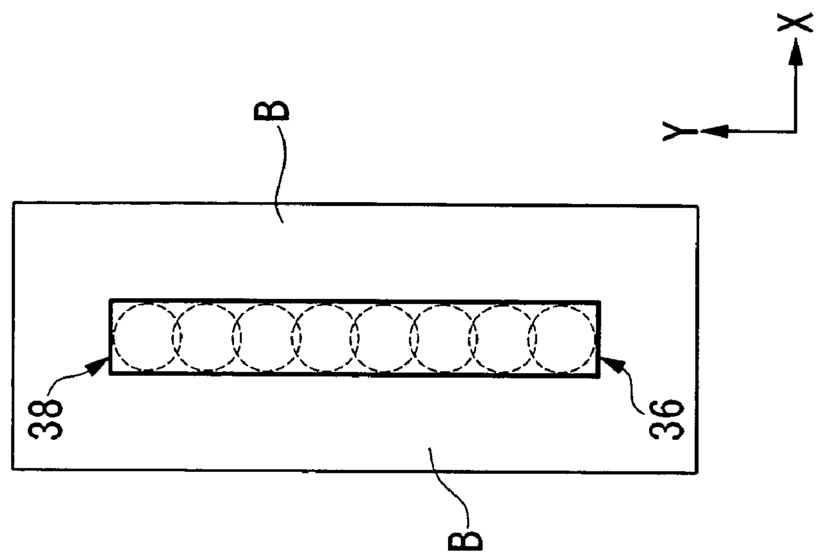
FIGS. 8A–8C are schematic diagrams showing an exemplary process for formation of a pattern according to the present invention.
Figure 8B:
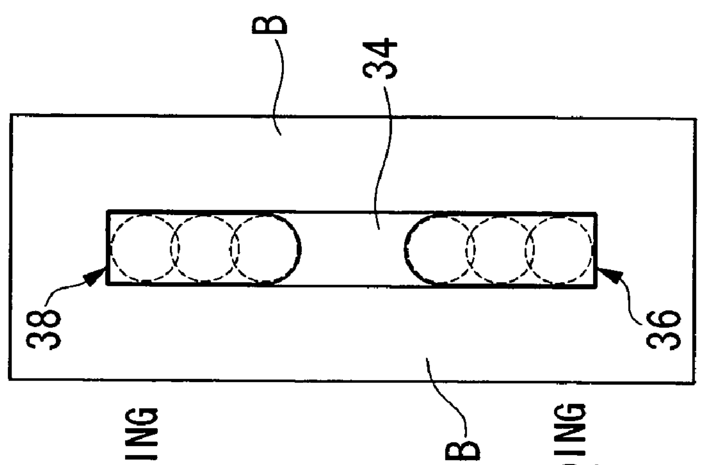
Figure 8A:
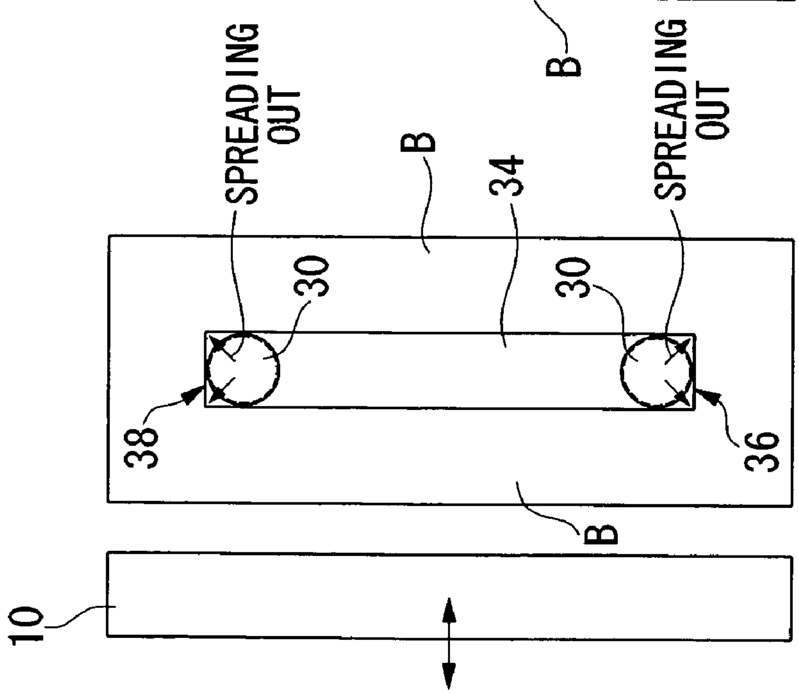

Furthermore, as shown in FIGS. 8A–8C, with the X axis direction taken as being the longitudinal direction of the groove portion 34, when disposing the liquid drops upon the substrate P using a liquid drop ejection head 10 which is provided with a plurality of ejection nozzles in a row along the Y axis direction, it would also be acceptable to arrange, so that the longitudinal direction of the groove portion 34 and the longitudinal direction of the liquid drop ejection head agree with one another, as shown in FIG. 8A, while sweeping the liquid drop ejection head 10 along the X axis direction, to selectively eject liquid drops 30 from those of the ejection nozzles, among the plurality of the ejection nozzles of the liquid drop ejection head 10, which correspond to the end portions 36 and 38 of the groove portion 34 at first; and next, as shown in FIGS. 8B and 8C, to dispose further liquid drops 30 in order towards the central portion in the longitudinal direction of the groove portion 34.

It should be understood that, in the above described preferred embodiment of the present invention, it is possible to employ various different types of material for the substrate upon which the electrically conductive film is disposed to produce the wiring pattern; for example, it would be possible to utilize glass, quartz glass, a silicon wafer, plastic film, a metallic plate, or the like. Furthermore, as an under-layer upon the surface of such a raw material substrate, it would also be possible to include a semiconductive layer, a metallic layer, a dielectric layer, an organic layer, or the like.

As the functional liquid for forming the electrically conductive film, in this example, a liquid dispersion (a liquid material) was used, in which minute electrically conductive particles including an organic silver compound were dispersed within a dispersion medium; this may be water-based or oil-based.

The minute electrically conductive particles which are used herein, in addition to being metallic minute particles which include any of gold, silver, copper, palladium, or nickel or the like, or a mixture thereof, may also be made from an electrically conductive polymer or a superconducting material or the like.

A coating such as an organic material or the like may also be used upon the surface of these minute electrically conductive particles, in order to enhance their dispersibility. As a coating material for such a coating for the surface of the minute electrically conductive particles, there may be suggested a hydrocarbons containing five or more carbon atoms, an alcohol, an ether, an ester, a ketone, an organic nitrogen compound, an organic silicon compound, an organic sulfur compound, or mixtures thereof or the like.

It is preferable for the diameter of the minute electrically conductive particles to be greater than or equal to 1 nm and less than or equal to 0.1 μm. If this diameter becomes greater than 0.1 μm, it may be possible that the nozzle of the above described liquid drop ejection head may be clogged. On the other hand, if this diameter is less than 1 nm, the ratio of the volume of the coating material to the volume of the minute electrically conductive particles becomes rather large, which results in excessive organic material in the resulting layer.

It is preferable for the vapor pressure at room temperature of the dispersion medium of the liquid including the minute electrically conductive particles to be greater than or equal to 0.001 mmHg and less than or equal to 200 mmHg (greater than or equal to 0.133 Pa and less than or equal to 26,600 Pa. If this vapor pressure is greater than 200 mmHg, then the dispersion medium evaporates very quickly after ejection, so that forming a good quality layer is difficult. Furthermore, it is more preferable for the vapor pressure at room temperature of this dispersion medium to be greater than or equal to 0.001 mmHg and less than or equal to 50 mmHg (greater than or equal to 0.133 Pa and less than or equal to 6,650 Pa. If this vapor pressure is greater than 50 mmHg, then, during an ejection step using an ink jet method, the nozzle of the ink jet apparatus may be easily clogged due to drying of the liquid drops during ejection. On the other hand, if the vapor pressure at room temperature of the dispersion medium is less than 0.001 mmHg, then the drying takes place very slowly, and some of the dispersion medium may be left in the resultant layer, so that, even after having performed heating and irradiation processing as a subsequent step, it is difficult to obtain an electrically conductive film of good quality.

The above described dispersion medium is not to be considered as being particularly limited, provided that it is capable of dispersing the above described minute electrically conductive particles, and provided that it does not cause agglomeration of the particles. Although in this preferred embodiment of the present invention diethylene glycol diethyl ether was utilized, as possible polar compounds, there may be cited, for example, water; alcohols such as methanol, ethanol, propanol, butanol and the like; hydrocarbons such as n-heptane, n-octane, decane, toluene, xylene, cymene, durene, indene, dipentene, tetrahydronaphthalene, decahydronaphthalene, cyclohexylbenzene and the like; ethers such as ethylene glycol dimethyl ether, ethylene glycol diethyl ether, ethylene glycol methyl ethyl ether, diethylene glycol dimethyl ether, diethylene glycol methyl ethyl ether, 1,2-dimethoxy ethane, bis-(2-methoxy ethyl)-ether, p-dioxane, and the like; or polar compounds such as propylene carbonate, γ-butylolactone, N-methyl-2-pyrolidone, dimethyl formamide, dimethyl sulfoxide, cyclohexanone or the like. Among these, from the point of view of dispersibility of the minute particles and stability of the dispersion liquid, and from the point of view of ease of application to the liquid drop ejection method, the use of water, alcohols, hydrocarbons, or ethers are preferable; and, as a more desirable dispersion medium, water or hydrocarbons are even more preferable. These dispersion mediums may be used independently, or as a mixture of two or more thereof.

The concentration of above described minute electrically conductive particles dispersed in the dispersion medium is greater than or equal to 1% by mass and less than or equal to 80% by mass, and is adjusted according to the thickness of the electrically conductive film which is desired. It should be understood that, if the concentration is greater than 80% by mass, agglomerations can easily occur, and it becomes difficult to obtain a uniform layer.

It is preferable for the surface tension of the dispersion liquid of the above described minute electrically conductive particles to be within the range of greater than or equal to 0.02 N/m and less than or equal to 0.07 N/m. When ejecting a liquid material using a liquid drop ejection method, if the surface tension is less than 0.02 N/m, it becomes easy for deviations during ejection of the liquid drops to occur, since the wettability of the liquid material with respect to the surface of the nozzle is increased, while, if the surface tension exceeds 0.07 N/m, it becomes difficult to control the ejection amount and the ejection timing, since the shape of the meniscus at the nozzle tip becomes unstable.

In order thus to adjust the surface tension, it will be acceptable to add to the above described dispersion liquid, in very small amount, within the range in which the contact angle with the substrate does not greatly decrease, a surface tension modifier such as a fluorine-containing, a silicon-containing, or a non-ionic material, or the like.

A non-ionic surface tension modifier increases the wettability of the liquid to the substrate, and improves the quality of leveling of the resulting layer, and is a material which serves to prevent the generation of minute concavities and convexities in this layer. It will also be acceptable, according to requirements, to include an organic compound such as an alcohol, an ether, an ester, a ketone or the like in the above described dispersion liquid.

It is preferable for the viscosity of the above described dispersion liquid to be greater than or equal to 1 mPa·s and less than or equal to 50 mPa·s. When ejecting liquid drops of this liquid material using a liquid drop ejection method, if the viscosity is less than 1 mPa·s, the portion surrounding the vicinity of the nozzle can easily be contaminated by the liquid material as it flows out of the nozzle, while, if the viscosity is greater than 50 mPa·s, it becomes difficult to eject liquid drops in a smooth manner, because the hole 5 in the nozzle may be frequently clogged.

Second Preferred Embodiment

Pattern Formation Method

Figure 9:
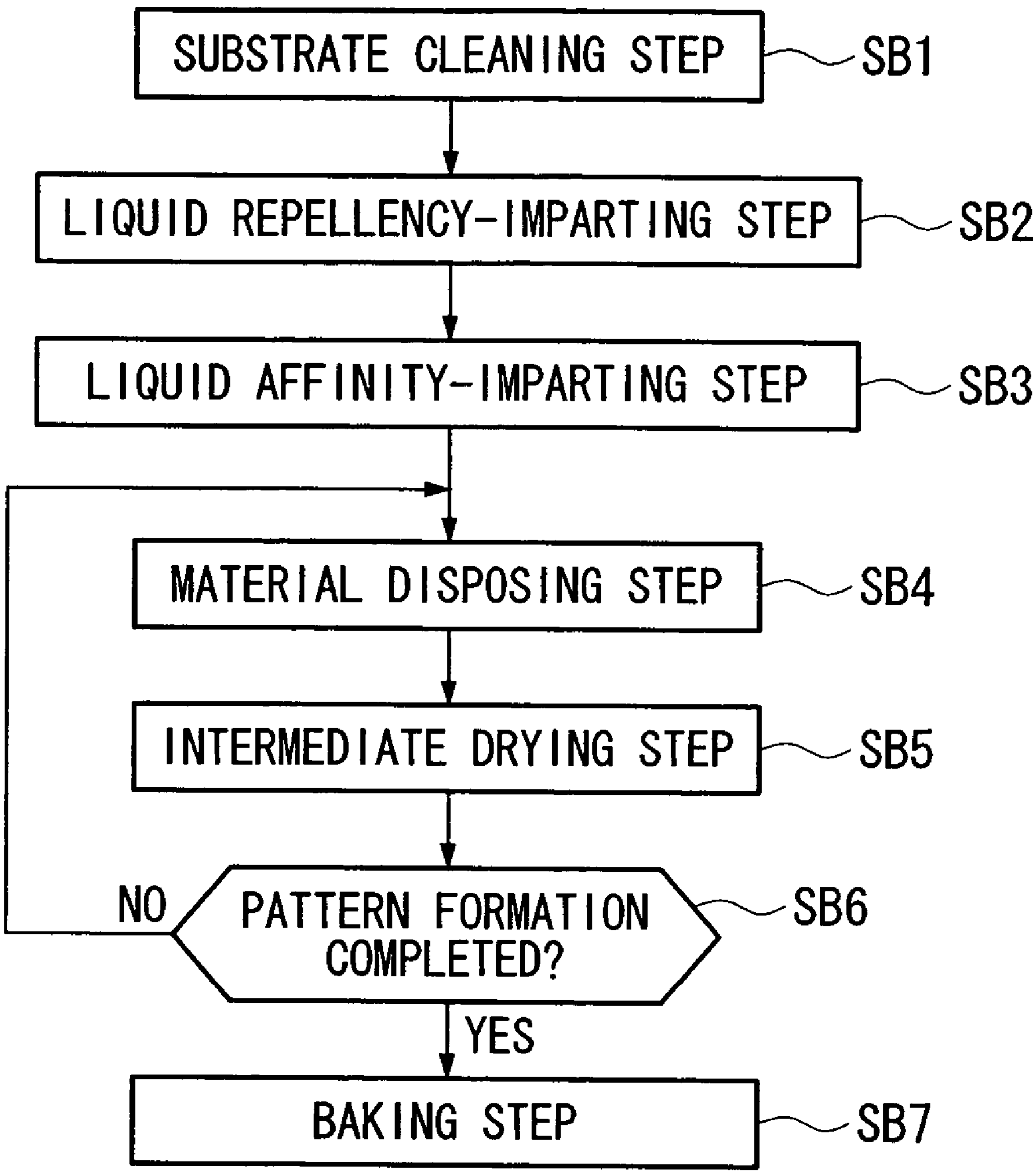
FIG. 9 is a flow chart showing another embodiment of the pattern formation method of the present invention.

In the following, a preferred embodiment of the pattern formation method according to the present invention will be explained with reference to the figures. FIG. 9 is a flow chart showing this preferred embodiment of the pattern formation method according to the present invention.

Here, for this second preferred embodiment of the present invention, an example will be explained in which an electrically conductive film wiring pattern is formed upon a glass substrate. Furthermore, as the functional liquid for making this electrically conductive film wiring pattern, there is used an organic silver compound dissolved in diethylene glycol diethyl ether solvent (a dispersion medium).

Referring to FIG. 9, the pattern formation method according to this second preferred embodiment of the present invention includes: a substrate cleaning step in which the substrate upon which the liquid drops of a functional liquid are to be disposed is cleaned using a predetermined solvent or the like (a step SB1); a liquid repellency-imparting step in which a liquid repellency is imparted to the substrate by providing a layer upon the surface of the substrate which has a liquid repellency (a step SB2); a liquid affinity-imparting step in which an affinity with liquid is imparted to a pattern formation region of the substrate surface which has been subjected to the liquid repellency-imparting treatment and upon which a wiring pattern is to be formed (a step SB3); a material disposing step in which liquid drops of the functional liquid are disposed upon the pattern formation region on the substrate, based upon a liquid drop ejection method, so as to build up (i.e., to form) a film pattern (a step SB4); an intermediate drying step, including heat processing or processing by irradiation with light, in which at least a portion of the liquid component of the functional liquid which has been disposed upon the substrate is removed (a step SB5); and a baking step in which the substrate, with the predetermined film pattern formed upon it, is fired (a step SB7). It should be understood that, after the intermediate drying step, a decision is made as to whether or not the drawing of the predetermined pattern has been completed (a step SB6), and, if the step of pattern drawing has been completed, the baking step is performed, while on the other hand, if the step of pattern drawing has not been completed, another episode of the material disposing step is performed.

In the following, each of these processes will be explained in detail.

Substrate Cleaning Step

First, the substrate is cleaned using a predetermined type of solvent or the like. By this, any organic material residue or the like which remains upon the substrate is removed. It should be understood that it would also be possible to remove such organic material residue by irradiating the substrate surface with ultraviolet light or the like.

Liquid Repellency-Imparting Step

Next, a liquid repellency with respect to the functional liquid is imparted to the surface of the substrate upon which the wiring pattern is to be formed. More specifically, surface treatment is performed upon the substrate so as to bring its predetermined contact angle with respect to the functional liquid to greater than or equal to 60°, and preferably greater than or equal to 90° and less than or equal to 110°. As a method for imparting this liquid repellency (wettability), it is possible to employ a method of providing a layer upon the substrate surface which is endowed with a liquid repellency. In this case, upon the surface of the substrate, a self-assembled layer is formed which is endowed with a liquid repellency.

As a method of forming such a self-assembled layer upon the surface of the substrate which can create an electrically conductive layer wiring pattern, a self-assembled layer is formed from an organic molecular film or the like. The organic molecular film for processing the substrate surface includes: a functional group which can be combined with the substrate; on its other side, a functional group which modifies the quality of (i.e., controls the surface energy of) the surface of the substrate, i.e., a group having an affinity with liquid or a liquid repelling group positioned at the opposite side of the substrate-combining functional group; and a carbon straight chain which connects together these functional groups, or a carbon chain which branches off from one portion thereof; and it constitutes a molecular film, for example a mono molecular film, which is of the same constitution as the substrate, and is combined with the substrate.

Here, the term "self assembled layer (a mono molecular film which assembles itself, i.e., a SAM (Self Assembled Monolayer))" means a layer which consists of connecting functional groups which can react with the constituent atoms of the under-layer of the substrate or the like, and, in addition to those groups, straight-chain molecules, and which is made by orienting a compound which has extremely high orientability due to interaction of its straight-chain molecules. Since such a self assembled layer is made by orienting mono-molecules, it can be made extremely thin, and moreover it is very uniform film upon at a molecular level. In other words, since all its molecules are positioned upon the same film surface, it has a very uniform film surface, as well as being able to impart an excellent liquid repellency or affinity with liquid.

As the above described compound endowed with high orientability, by using, for example, a fluoro alkyl silane (hereinafter referred to as "FAS"), a self assembled film is formed with the compounds being oriented so that the fluoro alkyl groups are positioned upon the surface of the film, and so that a uniform liquid repellency is imparted to the surface of the film. As FASs which is the compound for forming this type of self assembled layer, there may be suggested fluoro alkyl silanes such as hepta-deca-fluoro-1,1,2,2-tetra-hydro-decyl-tri-ethoxy-silane, hepta-deca-fluoro-1,1,2,2-tetra-hydro-decyl-tri-methoxy-silane, hepta-deca-fluoro-1,1,2,2-tetra-hydro-decyl-tri-chloro-silane, tri-deca-fluoro-1,1,2,2-tetra-hydro-octyl-tri-ethoxy-silane, tri-deca-fluoro-1,1,2,2-tetra-hydro-octyl-tri-methoxy-silane, tri-deca-fluoro-1,1,2,2-tetra-hydro-octyl-tri-chloro-silane, tri-fluoro-propyl-tri-methoxy-silane, or the like. These compounds may be used by themselves, or as a mixture of two or more thereof. It should be understood that, by using a FAS, it is possible to obtain both good adhesion to the substrate and also the desired liquid repellency.

A FAS is generally expressed by the structural formula $R_n$—Si—$X_{(4-n)}$, where n is an integer between 1 and 3 inclusive, and X is a methoxy group, an ethoxy group, a halogen atom or other hydrolytic group or the like. Furthermore, R is a fluoro alkyl group having a structure of $(CF_3)(CF_2)_x(CH_2)_y$(where x is an integer between 0 and 10 inclusive, and y is an integer between 0 and 4 inclusive), and, if a plurality of such Rs and/or Xs are combined with Si, it will also be acceptable either for the Rs and/or the Xs to be the same as one another, or alternatively for them to differ from one another. The hydrolytic groups which are expressed as X make a silanol by hydrolysis, and react with hydroxyl groups in the under-layer of the substrate (glass or silicon) by forming a siloxane bond.

On the other hand, since R includes a fluoro group such as $(CF_3)$ or the like upon its surface, it modifies the under surface of the substrate into a non wetting surface (whose surface energy is low).

Figure 10:
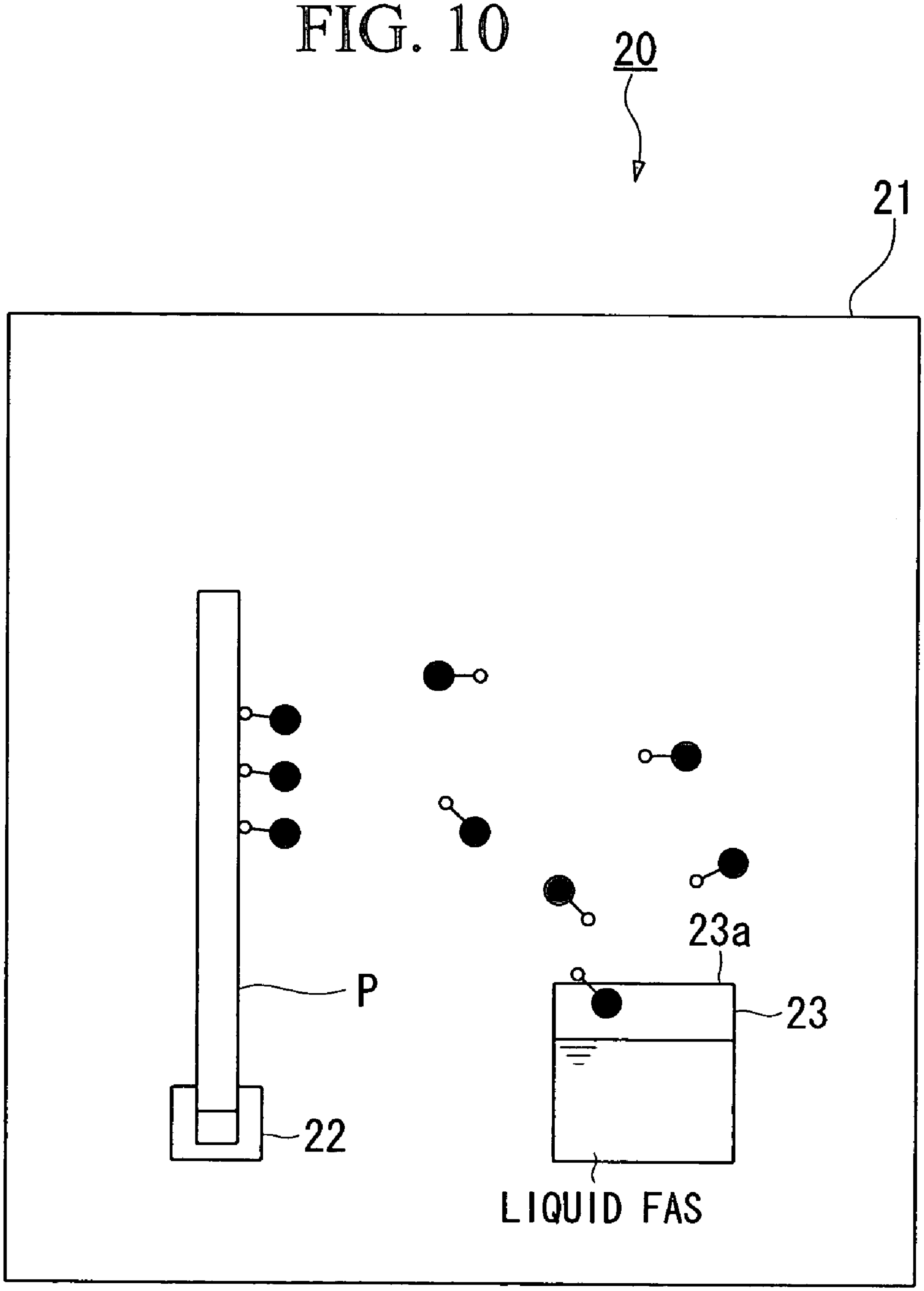
FIG. 10 is a schematic diagram showing an exemplary process for formation of a pattern according to the present invention.

FIG. 10 is a schematic diagram showing a FAS treatment system 20 which forms the self assembled layer (the FAS layer) made from FAS upon the substrate P. This FAS treatment system 20 forms the self assembled layer upon the substrate P from the FAS, and imparts a liquid repellency to it. As shown in FIG. 10, this FAS treatment system 20 includes a chamber 21, a substrate holder 22 which is provided within the chamber 21 and which supports the substrate P, and a vessel 23 which contains the FAS in a liquid phase (i.e., which holds liquid FAS). By disposing the substrate P within the chamber 21 and the vessel 23 containing the liquid FAS in a room temperature environment, the liquid FAS within the vessel 23 evaporates from the aperture portion 23*a* of the vessel 23 so as to be contained within the chamber 21 in a gas phase, and as a result, over, for example, about 2 to 3 days, a self assembled layer made from FAS is formed on the substrate P. Alternatively, by maintaining the entire chamber 21 at about 100° C., it is possible to form a self assembled layer upon the substrate P in about three hours.

It should be understood that, although in the above discussion the formation of a self assembled layer from the gas phase was explained, such a layer could also be formed from a liquid phase.

For example, the self assembled layer may be formed upon the substrate by soaking the substrate in a solution which contains the original source compound, cleaning it, and drying it.

It should be understood that it would also be acceptable for the layer which is endowed with a liquid repellency to be a fluoride polymer layer which is made by a plasma processing method.

With a plasma processing method, plasma irradiation is performed upon the substrate at normal pressure or in a vacuum. The type of gas which is utilized for such plasma processing may be selected in consideration of the surface material of the substrate P upon which it is required to create the wiring pattern, and the like. As such a process gas, for example, it is possible to utilize tetrafluoro-methane, perfluorohexane, perfluorodecane, or the like.

It should be understood that the processing for imparting a liquid repellency to the surface of the substrate P may also be performed by adhering a film which is endowed with the desired liquid repellency, for example a polyimide film which has been processed with tetrafluoro-ethylene or the like, to the surface of the substrate. Furthermore, it would also be acceptable to utilize such a polyimide film of which the liquid repellency is high as the substrate, just as it is.

Liquid Affinity-Imparting Step

After having performed FAS treatment upon the substrate P, liquid affinity-imparting treatment is performed in order to impart an affinity with liquid to the pattern formation region of the surface of the substrate upon which it is desired to form the wiring pattern. Ultraviolet light (UV) irradiation processing at a wavelength of 170 to 400 nm is suggested as a process for thus imparting an affinity with liquid. The liquid repellency of the pattern formation region of the substrate P which has been subjected to FAS treatment is decreased by irradiating the pattern formation region of the substrate P for just a predetermined time period with ultraviolet light of a predetermined power, and thereby the pattern formation region is endowed with the desired affinity with liquid.

Figure 11:
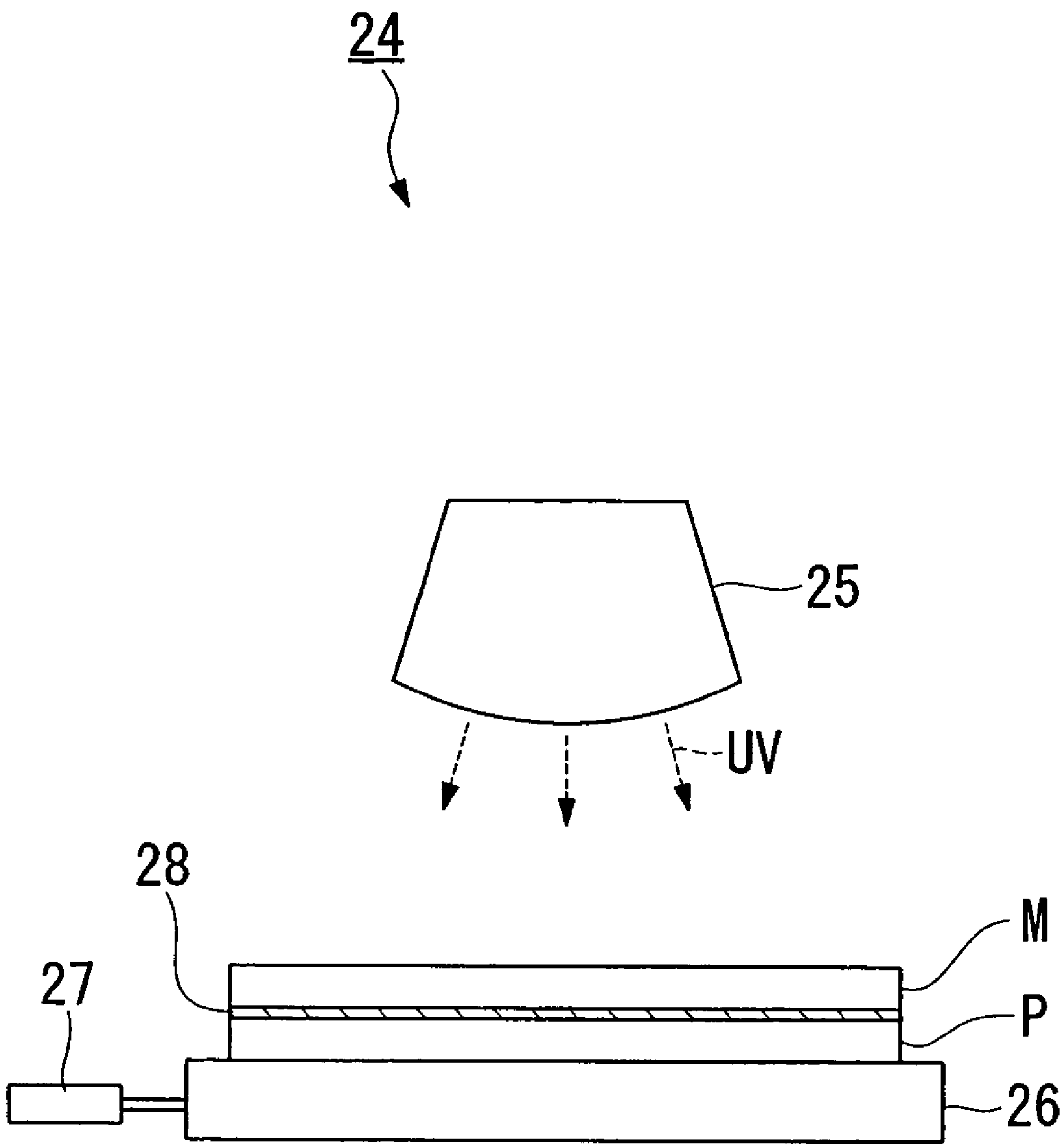
FIG. 11 is a schematic diagram showing an exemplary process for formation of a pattern according to the present invention.

FIG. 11 is a schematic diagram showing an ultraviolet light irradiation system 24 which irradiates ultraviolet light against the substrate P, upon which FAS treatment has been performed. As shown in FIG. 11, this ultraviolet light irradiation system 24 includes an ultraviolet light emission section 25 which is capable of emitting ultraviolet light (UV) having a predetermined wavelength, a stage 26 which supports the substrate P, and a stage drive section 27 which scans the stage 26 upon which the substrate P is supported in a predetermined direction.

This ultraviolet light irradiation system 24 irradiates ultraviolet light against the substrate P by emitting ultraviolet light from the ultraviolet light emission section 25 while scanning the substrate P in the predetermined direction. If the substrate P is small, then it would also be acceptable to irradiate the ultraviolet light against the substrate P without scanning it. It would also be acceptable to irradiate the ultraviolet light against the substrate P while shifting the ultraviolet light emission section 25, instead of shifting the substrate P. By thus irradiating the substrate P with ultraviolet light, the FAS layer upon the substrate P is destroyed, so that the region which has been irradiated with ultraviolet light is made to have an affinity with liquid (i.e., its liquid repellency is diminished).

Here, this ultraviolet light irradiation system 24 irradiates ultraviolet light upon the substrate P through a mask M which is provided with a pattern which corresponds to the pattern formation region upon the substrate P. By the ultraviolet light irradiation system 24 thus irradiating the ultraviolet light upon the substrate P through the mask M, the FAS layer is selectively destroyed, and thereby the pattern formation region upon the substrate P is made to have an affinity with liquid. When this is done, the FAS layer comes to be provided in the region which surrounds the pattern formation region. In this preferred embodiment of the present invention, a titanium oxide layer 28 is provided upon the lower surface of the mask M, and the ultraviolet light is irradiated such that this titanium oxide layer 28 and the surface of the substrate P are in mutual contact. By thus irradiating the ultraviolet light such that the titanium oxide layer 28 is in contact with the FAS layer, it is possible to impart an affinity with liquid (destruction of the FAS layer) in a short time period, due to a photocatalysis action of the titanium oxide material. It should be understood that, even if no such titanium oxide layer 28 is provided upon the lower surface of the mask M, it is possible to impart an affinity with liquid to the pattern formation region upon the substrate P; in other words, it is possible to impart an affinity with liquid to the pattern formation region upon the substrate P even by irradiating the ultraviolet light such that the mask M and the substrate P are separated from one another by a certain gap.

The irradiation operation of the ultraviolet light irradiation system 24 is controlled by a control unit which is not shown in the figures. This control unit sets the conditions for the ultraviolet light irradiation, and controls the irradiation operation of the ultraviolet light irradiation system 24 based upon these conditions which has been set. Here, the ultraviolet irradiation conditions which can be set are at least one of the time period for irradiation of the ultraviolet light upon the substrate P, the amount of irradiation upon the substrate P for a unit surface area (in other words, the amount of light), and the wavelength of the ultraviolet light which is irradiated, and the control unit controls the irradiation based upon at least one of these conditions.

By doing this, it is possible to endow the pattern formation region upon the substrate P with the desired affinity with liquid (i.e., with the desired contact angle with respect to the functional liquid).

It should be understood that, although herein, as the liquid affinity-imparting treatment, the use of ultraviolet light irradiation processing has been described, it would also be possible to reduce the liquid repellency of the substrate by exposing the substrate to ozone at ambient pressure.

Material Disposing Step

Next, the material disposing step that is included in the method according to this second preferred embodiment of the present invention will be explained with reference to FIGS. 12A–D. This material disposing step is a step of building up a film pattern (a wiring pattern) in the form of lines upon the substrate P by disposing liquid drops of a functional liquid, including a material for forming the wiring pattern, in a pattern formation region 74 by ejecting them from a liquid drop ejection head 10 of a liquid drop ejection device, and includes a first step in which liquid drops are disposed at the end portions of the pattern formation region 74, and a second step in which, after having disposed these liquid drops at the end portions, liquid drops are disposed at positions of the pattern formation region 74 other than its end portions. In this second preferred embodiment of the present invention, the functional liquid, which is the liquid for forming the wiring pattern, is a liquid in which an organic silver compound which includes silver is dispersed in diethylene glycol diethyl ether.

Figures 12A, 12B, 12C, 12D:
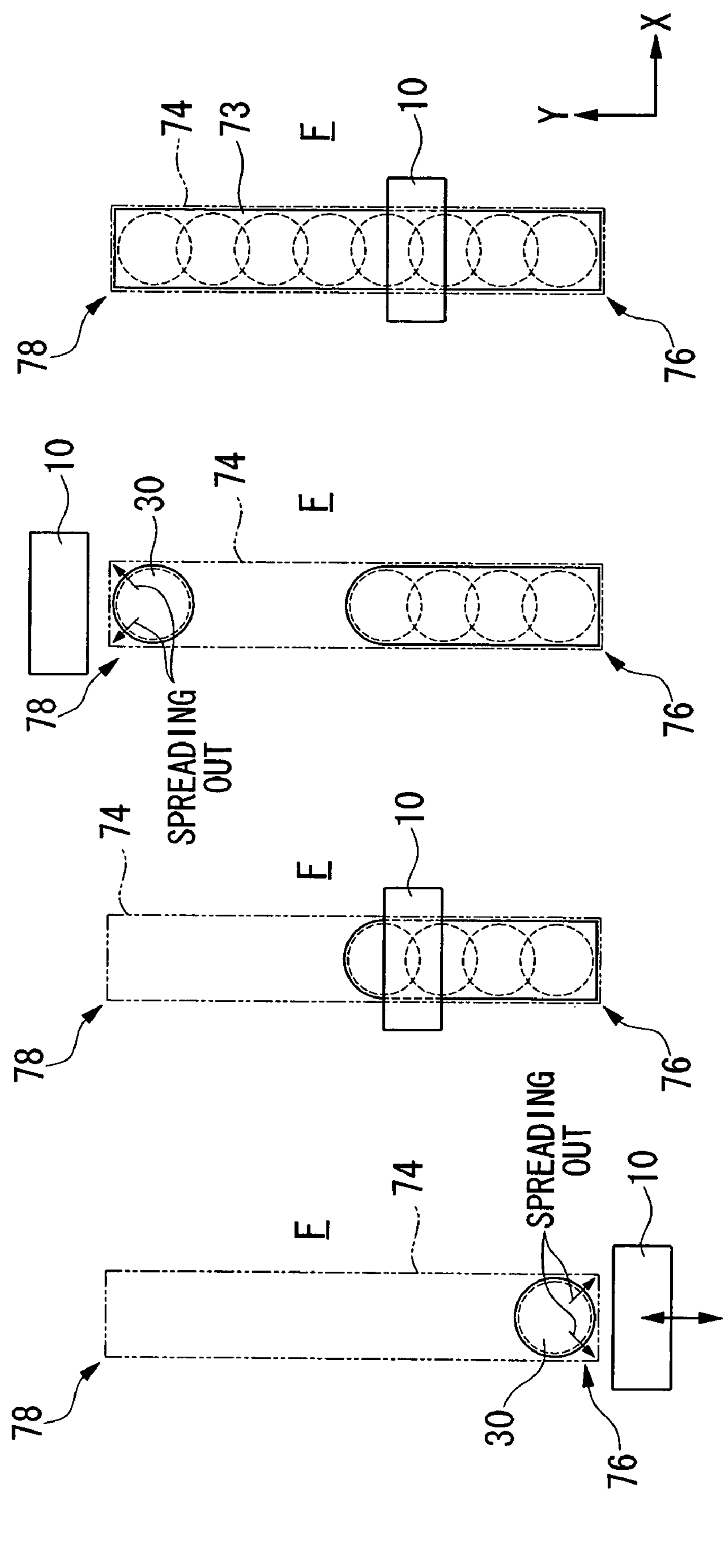
FIGS. 12A–12D are schematic diagrams showing an exemplary process for formation of a pattern according to the present invention.

In the above mentioned first step of this material disposing step, as shown in plan view in FIG. 12A, first, a liquid drop 30 which is ejected from the liquid drop ejection head 10 is disposed at one of the end portions 76 in the longitudinal direction of the pattern formation region 74 (the lower end portion thereof in the figure). Here, a FAS layer region F which is a liquid repelling region (i.e., a layer region which is endowed with a liquid repellency) surrounds the pattern formation region 74. Here the pattern formation region 74 is, in plan view, shaped as a rectangle whose longitudinal direction extends along the Y axis direction in the figure. Thus, the liquid drop 30 which has been ejected against the end portion 76 smoothly comes to be positioned at this end portion 76. Here, since a liquid repellency has been imparted to the liquid repelling region F, even if a portion of this liquid drop 30 which has thus been ejected should find its way into the liquid repelling region F, it is repelled from this liquid repelling region F, and again is smoothly disposed in the pattern formation region 74. Since the pattern formation region 74 has been endowed with an affinity with liquid, the liquid drop 30 which has been disposed upon this pattern formation region 74 wets it well and spreads out in a satisfactory manner.

When the liquid drop has been thus disposed at this end portion 76 in the longitudinal direction of the pattern formation region 74, as shown in FIG. 12B, a plurality of further liquid drops are ejected in succession from the liquid drop ejection head 10, while relatively shifting the liquid drop ejection head 10 along the Y axis direction with respect to the substrate P (in the upward direction in the figure). These liquid drops which are ejected from the liquid drop ejection head 10 are disposed in sequence along the main body of the pattern formation region 74 (i.e., along its portion other than its end portions 76 and 78). In FIG. 12B, an example is shown in which, after having disposed a liquid drop at one end portion 76 of the pattern formation region 74, a plurality of liquid drops are disposed in order along the central portion of the pattern formation region 74 along its longitudinal direction. By doing this, one portion of the wiring pattern is formed in a satisfactory manner.

At this time, since the pattern formation region 74 against which the liquid drops are ejected and in which it has been decided that the wiring pattern should be formed is surrounded by the liquid repelling region F, accordingly it is possible to prevent the liquid drops from spreading out to any regions other than their predetermined positions. Furthermore, since a liquid repellency has been imparted to the liquid repelling region F, even if some portion of one of these liquid drops 30 which has thus been ejected should be disposed on this liquid repelling region F, it is repelled from this liquid repelling region F due to the liquid repellency which has been imparted to this liquid repelling region F, and again flows into the pattern formation region 74. Since the pattern formation region 74 of the substrate P has been endowed with an affinity with liquid, the liquid drops 30 which have been ejected into this pattern formation region 74 wet it well and spread out in a satisfactory manner, so that thereby the functional liquid comes to be disposed evenly in its predetermined position.

It should be understood that although, in the example shown in FIG. 12B, the structure is such that, when the next liquid drop 30 is ejected after a previous liquid drop 30 has been disposed upon the substrate P, the next liquid drop 30 is ejected so that a portion thereof overlaps a portion of the previous liquid drop 30 as it is disposed upon the substrate P, according to requirements, between the time point at which the previous liquid drop 30 has been disposed upon the substrate P and the time point at which the next liquid drop 30 is ejected, an intermediate drying step (a step SB5) may be performed in order to remove the liquid component (i.e., of the dispersion medium) in the previous liquid drop 30 which has already been disposed upon the substrate P. Such an intermediate drying step, in addition to being a conventional heat treatment which is performed by using a heating device such as, for example, a hot plate, an electric furnace, a hot air dryer, or the like, may also be a processing by irradiation with light using lamp annealing.

Next, as shown in FIG. 12C, the liquid drop ejection head 10 is shifted to the other one 78 of the end portions in the longitudinal direction of the pattern formation region 74 (the uppermost end portion thereof in the figure). A liquid drop is ejected from the liquid drop ejection head 10 against this end portion 78. This liquid drop which has been ejected against the end portion 78 smoothly comes to be disposed against the end portion 78 of the pattern formation region 74. Here, since a liquid repellency has been imparted to the pattern formation region 74, this liquid drop wets it well and spreads out over it in an efficient and reliable manner.

When the liquid drop has been thus disposed at this end portion 78 in the longitudinal direction of the pattern formation region 74, as shown in FIG. 12D, a plurality of further liquid drops are ejected in succession from the liquid drop ejection head 10, while relatively shifting the liquid drop ejection head 10 along the Y axis direction with respect to the substrate P. These liquid drops which are ejected from the liquid drop ejection head 10 are disposed in sequence along the central portion in the longitudinal direction of the main body of the pattern formation region 74 (i.e., along its portion other than its end portions 36 and 38). They connect with the portion of the wiring pattern that has already been formed, and thereby the entire wiring pattern 73 (the film pattern) is formed.

It should be understood that, as the conditions under which the liquid drops are ejected, for example, it is possible to employ a weight of the ink of about 4 ng/dot, and an ink speed (ink ejection speed) of 5 to 7 m/sec. Furthermore, it is preferable to arrange to set the ambient atmosphere into which the liquid drops are ejected to be at a temperature of less than or equal to 60° C. and a humidity of less than or equal to 80%. By doing this, it is possible for the ejection nozzle of the liquid drop ejection head 10 to eject of the liquid drops in a stable manner without any clogging taking place.

Intermediate Drying Step

After a liquid drop has thus been ejected against the substrate P, according to requirements, a drying step is performed in order to remove the dispersion medium in this liquid drop, and in order to ensure a thin layer of desired thickness is formed. Such a drying step may be performed by, for example, a conventional method of heating up the substrate P with a hot plate, an electric furnace, a hot air dryer, or the like; or alternatively lamp annealing may also be employed. The light source which is used for such lamp annealing is not to be considered as being particularly limited, but it may be an infrared lamp, a xenon lamp, a YAG laser, an argon laser, a carbon dioxide gas laser, or an excimer laser such as a XeF, XeCl, XeBr, KrF, KrCl, ArF, or ArCl laser or the like. These light sources are generally utilized in the output power range from 10 W to 5000 W, but, in this second preferred embodiment of the present invention, an output power of from 100 W to 1000 W is considered to be sufficient. By repeating this intermediate drying step and the above described material disposing step, a plurality of layers of liquid drops of the functional liquid are built up in superimposition, and thereby a thick wiring pattern (film pattern) is formed.

Baking Step

After the drop ejection step, a drying step is required for completely removing the dispersion medium, in order to ensure good electrical contact between the minute particles. Furthermore, if a coating material such as an organic material or the like has been coated on the surface of the electrically conductive minute particles in order to enhance the dispersibility, it is also necessary to remove this coating material. Yet further, if an organic silver compound is included in the functional liquid, it is necessary to perform heat treatment in order to obtain electrical conductivity, and to remove the organic component in the organic silver compound so as to leave silver particles remaining. For this, heat processing and/or processing by light is performed after the ejection step. Such heat processing and/or processing by light is normally performed in the ambient atmosphere, but, according to requirements, it could be performed in an inactive gas atmosphere, such as nitrogen, argon, helium or the like. The processing temperature for this heat processing and/or processing by light is set suitably, in consideration of the boiling point (the vapor pressure) of the dispersion medium, the type and pressure of the gas atmosphere, the thermal behavior of the minute particles such as their dispersibility and oxidizability and so on, the presence or absence of any coating material and the amount thereof, the heat resistant temperature of the substrate itself, and so on. For example, in order to remove a coating material which consists of an organic material, it is necessary to perform baking at about 300° C. Furthermore, in order to remove, for example, the organic component of an organic silver compound, it is necessary to perform baking at about 200° C. Yet further, if a substrate made of plastic or the like is utilized, it is preferable to perform baking above room temperature but at less than or equal to 100° C. The electrical contact between the minute particles in the electrically conductive material (the organic silver compound) after the ejection step is ensured by the above described process, and it is converted into an electrically conductive layer 73 (i.e., a wiring pattern).

Next, an example of another liquid drop disposing process when forming a wiring pattern 73 will be explained with reference to FIGS. 13A–13C.

Figure 13A:
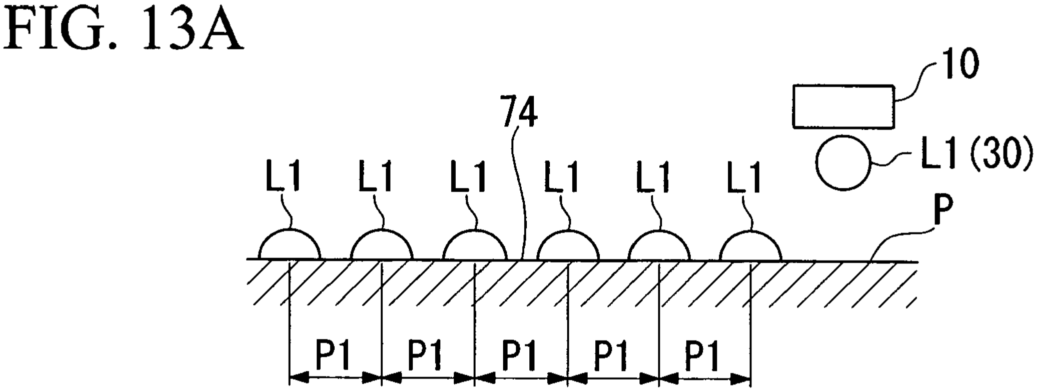
FIGS. 13A–13C are schematic diagrams showing an exemplary process for formation of a pattern according to the present invention.

First, as shown in FIG. 13A, liquid drops L1 which have been ejected from the liquid drop ejection head 10 are disposed in order upon the substrate P with predetermined intervals between them. In other words, the liquid drop ejection head 10 is positioned over the substrate P so that the liquid drops L do not overlap one another (in a first disposing step). In this example, the disposition pitch P1 at which the liquid drops L1 are disposed is set so as to be greater than the diameter of the liquid drops L1 immediately after they have been disposed upon the substrate P. By doing this, immediately after the liquid drops L1 have been disposed upon the substrate P, they do not overlap one another (do not touch one another), so that the liquid drops L1 are prevented from wetting and spreading out upon the substrate P and coalescing with one another. Furthermore, the pitch P1 at which the liquid drops L1 are disposed is set so as to be less than or equal to twice the diameter of the liquid drops L1 immediately after they have been disposed upon the substrate P. Here, according to requirements, after the liquid drops L1 have been disposed upon the substrate P, it is possible to perform an intermediate drying step (the step SB5), in order to remove the dispersion medium.

Figure 13B:
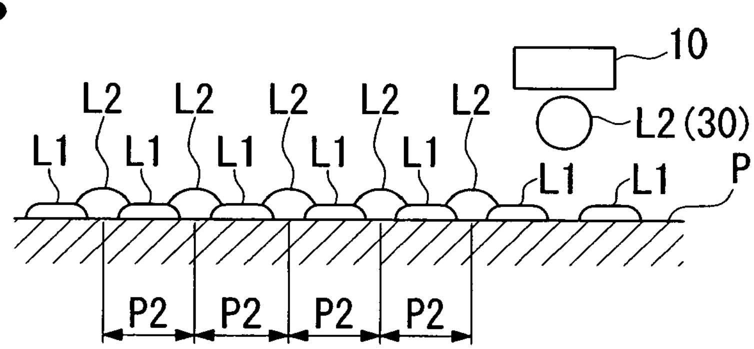

Next, as shown in FIG. 13B, the disposition of liquid drops described above is repeated. In other words, in the same manner shown in FIG. 13A, the functional liquid is ejected from the liquid drop ejection head 10 as liquid drops L2, and these liquid drops L2 are disposed upon the substrate P at a fixed distance apart from one another. At this time, the volume of the liquid drops L2 (the amount of functional liquid per each single such liquid drop L2), and the pitch at which these liquid drops L2 are disposed upon the substrate P, are the same as for the liquid drops L1 during the previous disposing step described above. The positions on which the liquid drops L2 are disposed are shifted by just ½ of this pitch from the positions in which the liquid drops L1 were disposed during the previous disposing step, so that these liquid drops L2 which are disposed during this episode (the second disposing step) are disposed in positions at the center between adjoining ones of the liquid drops L1 which were disposed upon the substrate P during the previous disposing step. As has been explained above, the disposition pitch P1 at which the liquid drops L1 are disposed upon the substrate P is set to be greater than the diameter of these liquid drops L1 immediately after they have thus been disposed upon the substrate P, while being less than or equal to twice that diameter. Because of this, portions of the liquid drops L1 and the liquid drops L2 are overlapped by disposing the liquid drops L2 in positions at the center between the liquid drops L1, and the gaps between adjacent ones of the liquid drops L1 are filled up by the liquid drops L2. At this time, although the liquid drops L2 which are disposed in this disposing step come into contact with and overlap the liquid drops L1 which have been disposed during the previous disposing step, very little coalescence of the liquid drops L1 and L2 and spreading out of the coalesced mass thereof occurs, since the dispersion medium which was present in the liquid drops L1 which have been disposed during the previous disposing step has by now completely or at least mostly been removed. After the liquid drops L2 have been disposed upon the substrate P, it is possible to perform the intermediate drying step described above, according to requirements, in order to remove the dispersion medium in the liquid drops L2, in the same way as was described above for eliminating the dispersion medium in the liquid drops L1.

Figure 13C:
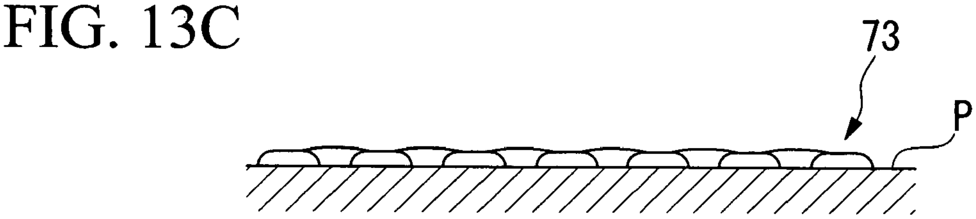

By repeating such a disposing step of liquid drops a plurality of times, the gaps between the adjacent liquid drops which are disposed upon the substrate P are filled up, and, as shown in FIG. 13C, a wiring pattern 73 consisting of continuous wiring in the desired pattern is built up on the substrate P. In this case, it is possible to increase the thickness of the wiring pattern 73 by increasing the number of times of repetition of the disposition of liquid drops, thus disposing liquid drops in succession upon the substrate P so that they overlap one another.

It should be understood that although, in FIG. 13B, the position at which the disposition of the liquid drops L2 starts is the same side as in the previous disposing step (i.e., the left side as shown in FIG. 13A), it would also be acceptable for it to be on the opposite side (i.e., the right side). By performing the ejection of the liquid drops while shifting the liquid drop ejection head in a to-and-fro motion, it is possible to reduce the distance through which the liquid drop ejection head 10 and the substrate P must be shifted relative to one another.

Next, another example of the pattern for disposing the liquid drops of the functional liquid will be explained with reference to FIGS. 14 and 15. Here, in the explanation using FIGS. 14 and 15, the reference numeral 1 is used to denote that liquid drop which has first been disposed upon the substrate P (in the pattern formation region 74), while the reference numerals 2, 3, . . . are used to denote the liquid drops which have been subsequently disposed, in that order.

Figure 14:
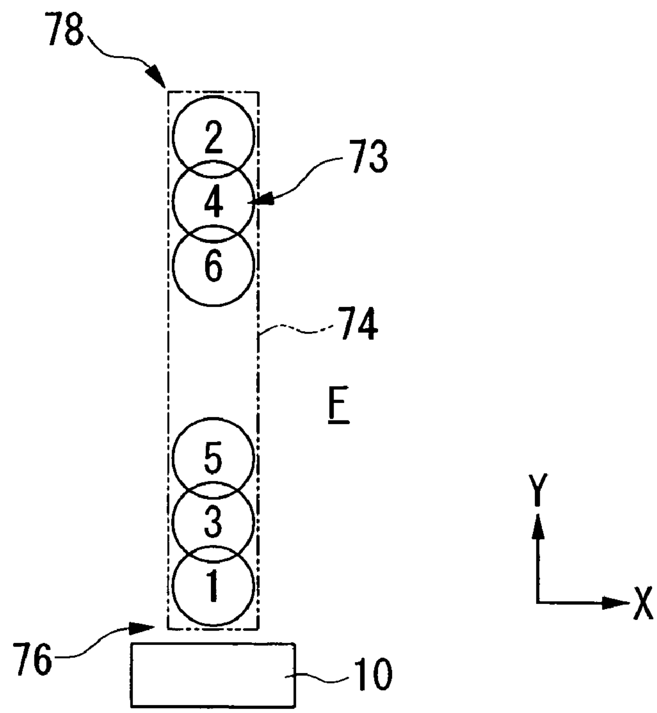
FIG. 14 is a schematic diagram showing an exemplary process for formation of a pattern according to the present invention.
Figure 15:
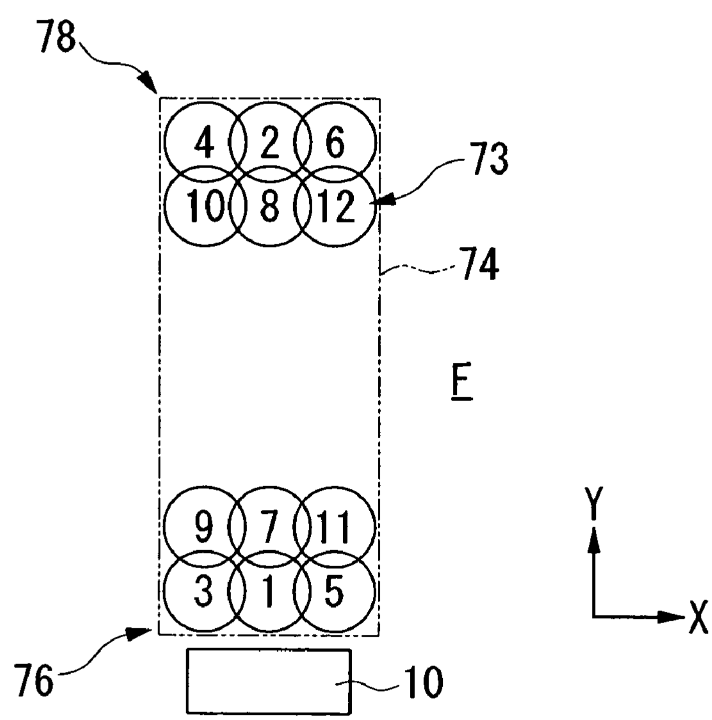
FIG. 15 is a schematic diagram showing an exemplary process for formation of a pattern according to the present invention.

As shown in FIG. 14, it is possible to arrange to dispose a first liquid drop 1 at one end portion 76 of the pattern formation region 74 in its one longitudinal direction, and next a second liquid drop 2 is disposed at the other end portion 78 of the pattern formation region 74 in its other longitudinal direction; and, thereafter, the other liquid drops are disposed in order towards the center of the pattern formation region 74, with the odd numbered drops adjacent to one another in order from the one end portion 36, and the even numbered drops adjacent to one another in order from the other end portion 38.

Figures 16A, 16B, 16C:
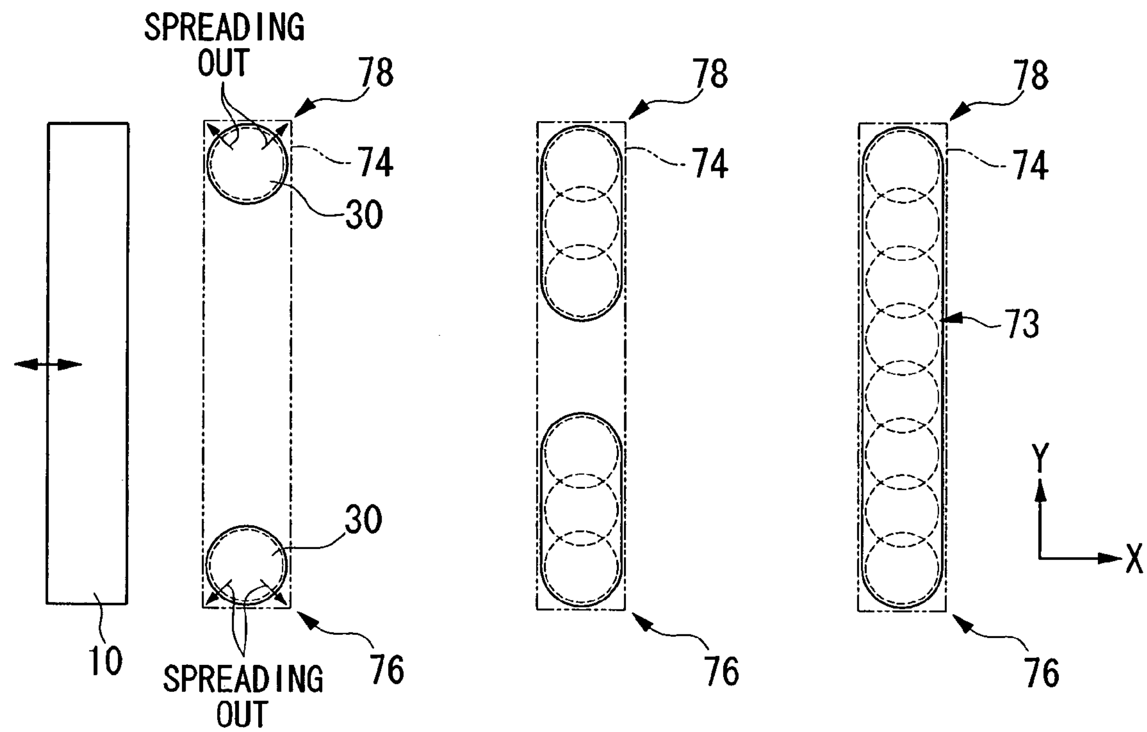
FIGS. 16A–16C are schematic diagrams showing an exemplary process for formation of a pattern according to the present invention.

Furthermore, as shown in FIGS. 16A–16C, with the Y axis direction taken as being the longitudinal direction of the pattern formation region 74, when disposing the liquid drops upon the substrate P using a liquid drop ejection head 10 which is provided with a plurality of ejection nozzles in a row along the Y axis direction, it would also be acceptable to arrange, such that the longitudinal direction of the pattern formation region 74 and the longitudinal direction of the liquid drop ejection head 10 agree with one another, as shown in FIG. 16A, while sweeping the liquid drop ejection head 10 along the X axis direction, to selectively eject liquid drops 30 from those of the ejection nozzles, among the plurality of the ejection nozzles of the liquid drop ejection head 10, which correspond to the end portions 76 and 78 of the pattern formation region 74; and next, as shown in FIGS. 16B and 16C, to dispose further liquid drops 30 in order towards the central portion in the longitudinal direction of the pattern formation region 74.

Furthermore, as shown in FIGS. 16A–C, with the Y axis direction taken as being the longitudinal direction of the pattern formation region 74, when disposing the liquid drops upon the substrate P using a liquid drop ejection head 10 which is provided with a plurality of ejection nozzles in a row along the Y axis direction, it would also be acceptable to arrange, such that the longitudinal direction of the pattern formation region 74 and the longitudinal direction of the liquid drop ejection head 10 agree with one another, as shown in FIG. 16A, while sweeping the liquid drop ejection head 10 along the X axis direction, to selectively eject liquid drops 30 from those of the ejection nozzles, among the plurality of the ejection nozzles of the liquid drop ejection head 10, which correspond to the end portions 76 and 78 of the pattern formation region 74; and next, as shown in FIGS. 16B and 16C, to dispose further liquid drops 30 in order towards the central portion in the longitudinal direction of the pattern formation region 74.

It should be understood that, in the above described preferred embodiment of the present invention, it is possible to employ various different types of material for the substrate upon which the electrically conductive film is disposed to produce the wiring pattern; for example, it would be possible to utilize glass, quartz glass, a silicon wafer, plastic film, a metallic plate, or the like. Furthermore, as an under-layer upon the surface of such a raw material substrate, it would also be possible to include a semiconductive layer, a metallic layer, a dielectric layer, an organic layer, or the like.

As the functional liquid for creating the electrically conductive film, in this example, a liquid dispersion (a liquid material) was used, in which minute electrically conductive particles including an organic silver compound were dispersed within a dispersion medium; this may be water-based or oil-based.

The minute electrically conductive particles which are used herein, in addition to being metallic minute particles which include any of gold, silver, copper, palladium, or nickel or the like, or a mixture thereof, may also be made from an electrically conductive polymer or a superconducting material or the like.

A coating such as an organic material or the like may also be used upon the surface of these minute electrically conductive particles, in order to enhance their dispersibility. As a coating material for such a coating for the surface of the minute electrically conductive particles, there may be suggested a hydrocarbons containing five or more carbon atoms, an alcohol, an ether, an ester, a ketone, an organic nitrogen compound, an organic silicon compound, an organic sulfur compound, or mixtures thereof or the like.

It is preferable for the diameter of the minute electrically conductive particles to be greater than or equal to 1 nm and less than or equal to 0.1 $\mu$m. If this diameter becomes greater than 0.1 $\mu$m, it may be possible that the nozzle of the above described liquid drop ejection head may be clogged. On the other hand, if this diameter is less than 1 nm, the ratio of the volume of the coating material to the volume of the minute electrically conductive particles becomes rather large, which results in excessive organic material in the resulting layer.

It is preferable for the vapor pressure at room temperature of the dispersion medium of the liquid including the minute electrically conductive particles to be greater than or equal to 0.001 mmHg and less than or equal to 200 mmHg (greater than or equal to 0.133 Pa and less than or equal to 26,600 Pa. If this vapor pressure is greater than 200 mmHg, then the dispersion medium evaporates very quickly after ejection, so that forming a good quality layer is difficult. Furthermore, it is more preferable for the vapor pressure at room temperature of this dispersion medium to be greater than or equal to 0.001 mmHg and less than or equal to 50 mmHg (greater than or equal to 0.133 Pa and less than or equal to 6,650 Pa. If this vapor pressure is greater than 50 mmHg, then, during an ejection step using an ink jet method, the nozzle of the ink jet apparatus may be easily clogged due to drying of the liquid drops during ejection. On the other hand, if the vapor pressure at room temperature of the dispersion medium is less than 0.001 mmHg, then the drying takes place very slowly, and some of the dispersion medium may be left in the resultant layer, so that, even after having performed heating and irradiation processing as a subsequent step, it is difficult to obtain an electrically conductive film of good quality.

The above described dispersion medium is not to be considered as being particularly limited, provided that it is capable of dispersing the above described minute electrically conductive particles, and provided that it does not cause agglomeration of the particles. Although in this preferred embodiment of the present invention diethylene glycol diethyl ether was utilized, as possible polar compounds, there may be cited, for example, water; alcohols such as methanol, ethanol, propanol, butanol and the like; hydrocarbons such as n-heptane, n-octane, decane, toluene, xylene, cymene, durene, indene, dipentene, tetrahydronaphthalene, decahydronaphthalene, cyclohexylbenzene and the like; ethers such as ethylene glycol dimethyl ether, ethylene glycol diethyl ether, ethylene glycol methyl ethyl ether, diethylene glycol dimethyl ether, diethylene glycol methyl ethyl ether, 1,2-dimethoxy ethane, bis-(2-methoxy ethyl)-ether, p-dioxane, and the like; or polar compounds such as propylene carbonate, γ-butylolactone, N-methyl-2-pyrolidone, dimethyl formamide, dimethyl sulfoxide, cyclohexanone or the like. Among these, from the point of view of dispersibility of the minute particles and stability of the dispersion liquid, and from the point of view of ease of application to the liquid drop ejection method, the use of water, alcohols, hydrocarbons, or ethers are preferable; and, as a more desirable dispersion medium, water or hydrocarbons are even more preferable. These dispersion mediums may be used independently, or as a mixture of two or more thereof.

The concentration of above described minute electrically conductive particles dispersed in the dispersion medium is greater than or equal to 1% by mass and less than or equal to 80% by mass, and is adjusted according to the thickness of the electrically conductive film which is desired. It should be understood that, if the concentration is greater than 80% by mass, agglomerations can easily occur, and it becomes difficult to obtain a uniform layer.

It is preferable for the surface tension of the dispersion liquid of the above described minute electrically conductive particles to be within the range of greater than or equal to 0.02 N/m and less than or equal to 0.07 N/m. When ejecting a liquid material using a liquid drop ejection method, if the surface tension is less than 0.02 N/m, it becomes easy for deviations during ejection of the liquid drops to occur, since the wettability of the liquid material with respect to the surface of the nozzle is increased, while, if the surface tension exceeds 0.07 N/m, it becomes difficult to control the ejection amount and the ejection timing, since the shape of the meniscus at the nozzle tip becomes unstable.

In order thus to adjust the surface tension, it will be acceptable to add to the above described dispersion liquid, in very small amount, within the range in which the contact angle with the substrate does not greatly decrease, a surface tension modifier such as a fluorine-containing, a silicon-containing, or a non-ionic material, or the like.

A non-ionic surface tension modifier increases the wettability of the liquid to the substrate, and improves the quality of leveling of the resulting layer, and is a material which serves to prevent the generation of minute concavities and convexities in this layer. It will also be acceptable, according to requirements, to include an organic compound such as an alcohol, an ether, an ester, a ketone or the like in the above described dispersion liquid.

It is preferable for the viscosity of the above described dispersion liquid to be greater than or equal to 1 mPa·s and less than or equal to 50 mPa·s. When ejecting liquid drops of this liquid material using a liquid drop ejection method, if the viscosity is less than 1 mPa·s, the portion surrounding the vicinity of the nozzle can easily be contaminated by the liquid material as it flows out of the nozzle, while, if the viscosity is greater than 50 mPa·s, it becomes difficult to eject liquid drops in a smooth manner, because the hole 5 in the nozzle may be frequently clogged.

Pattern Formation Apparatus

Figure 17:
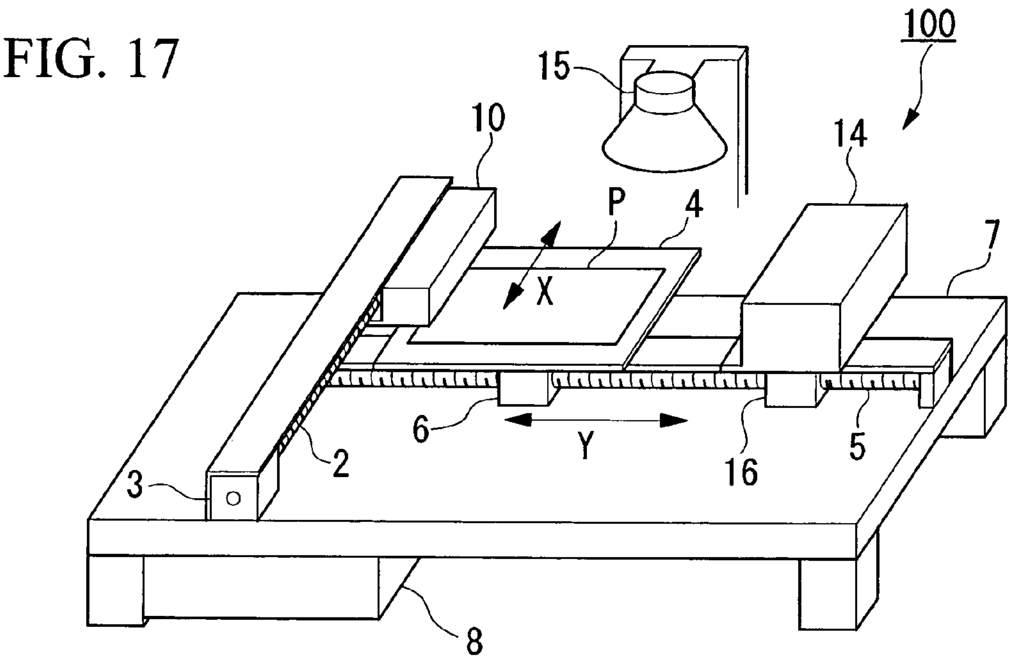
FIG. 17 is a schematic diagram showing an exemplary process for formation of a pattern according to the present invention.

Next, an example of the pattern formation apparatus according to the present invention will be explained with reference to FIG. 17. FIG. 17 is a schematic perspective view showing the pattern formation apparatus according to this preferred embodiment. As shown in FIG. 17, this pattern formation apparatus 100 includes an X direction guide shaft 2 for driving a liquid drop ejection head 10 in the X direction, an X direction drive motor 30 which rotates this X direction guide shaft 2, a support stand 4 for supporting a substrate P, a Y direction guide shaft 5 for driving the support stand 4 in the Y direction, a Y direction drive motor 6 which rotates the Y direction guide shaft 5, a cleaning mechanism section 14, a heater 15, a control unit 8 which controls these devices in a centralized manner, and the like. Each of the X direction guide shaft 2 and the Y direction guide shaft 5 is fixed upon a main stand 7. It should be understood that, although in FIG. 17 the liquid drop ejection head 10 is shown as being arranged at right angles to the direction in which the substrate P is shifted, it would also be acceptable to adjust the angle of the liquid drop ejection head 10, so as to make it intersect the direction of shifting of the substrate P at any desired angle. If this is done, by adjusting the angle of the liquid drop ejection head 10 relative to the direction in which the substrate P is shifted, it is possible to adjust the pitch between the nozzles of the liquid drop ejection head 10 as desired. Furthermore, it would also be acceptable to arrange so that the distance between the substrate P and the nozzle surface of the liquid drop ejection head 10 can be adjusted as desired.

The liquid drop ejection head 10 ejects from an ejection nozzle (an ejection aperture) functional liquid which contains minute electrically conductive particles or an organic silver compound dispersed in a dispersion liquid, and is fixed to the X direction guide shaft 2. The X direction drive motor 3 is a stepping drive motor or the like, and, when it is supplied with a drive pulse signal for the X axis direction from the control unit 8, it rotates the X direction guide shaft 2. By this rotation of the X direction guide shaft 2, the liquid drop ejection head 10 is shifted in the X direction with respect to the main stand 7.

As the method for this liquid drop ejection, it is possible to apply various known techniques, such as a piezo method in which the functional liquid is ejected by using a piezoelectric element, or a bubble method in which the functional liquid is heated up and is then ejected due to the formation of bubbles therein, or the like. Among these, since the piezo method is one in which heat is not applied to the functional liquid, it has the beneficial aspect that the composition of the material which is utilized is not affected, and the like. It should be understood that, in this example, the above piezo method is utilized, from the point of view of the great flexibility which it offers in the selection of the liquid material, and the good controllability of the liquid drops which it provides.

The support stand 4 is fixed to the Y direction guide shaft 5, and Y direction drive motors 6 and 16 are connected to this Y direction guide shaft 5. These Y direction drive motors 6 and 16 are stepping drive motors or the like, and, when they are supplied with drive pulse signals for the Y axis direction from the control unit 8, they rotate the Y direction guide shaft 5. The support stand 4 is shifted in the Y direction with respect to the main stand 7 by this rotation of the Y direction guide shaft 5. The cleaning mechanism section 14 is a device for cleaning the liquid drop ejection head 10, thus preventing clogging of its nozzles. In the above described cleaning, this cleaning mechanism section 14 is shifted along the Y direction guide shaft 5 by the Y direction drive motor 16. The heater lamp 15 is for heat processing the substrate P using a heating means such as lamp annealing or the like, and, along with performing evaporation and drying of the liquid which has been ejected upon the substrate P, also perform heat treatment for converting the liquid into an electrically conductive film.

With this pattern formation apparatus 100 according to this preferred embodiment of the present invention, by shifting the substrate P and the liquid drop ejection head 10 with respect to one another via the X direction drive motor 3 and the Y direction drive motor 6 while ejecting drops of the functional liquid from the liquid drop ejection head 10, these drops of the functional liquid are disposed upon the substrate P. The amount of material in each of the liquid drops which is ejected from each nozzle of the liquid drop ejection head 10 is controlled by the voltage which is supplied to the piezo element from the control unit 8. Furthermore, the pitch of the liquid drops at which are disposed upon the substrate P is controlled by the speed of the above described relative shifting, and the frequency of ejection (the frequency of the drive voltage which is supplied to the piezo element) of the liquid drops from the liquid drop ejection head 10. Yet further, the position where the disposition of liquid drops commences upon the substrate P is controlled by the direction of the above described relative shifting, the timing at which the ejection of the liquid drops from the liquid drop ejection head 10 is started during the above described relative shifting, and the like. In this manner, the previously described wiring pattern 33 is formed upon the substrate P.

Plasma Processing System

Figure 18:
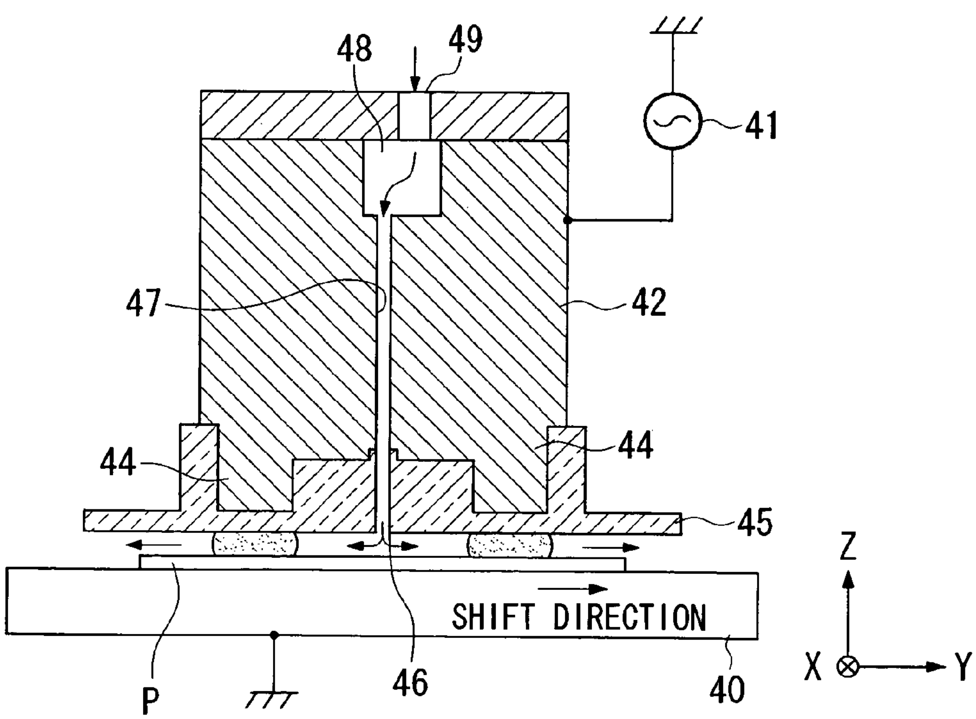
FIG. 18 is a schematic diagram showing an example of a plasma processing system.

FIG. 18 is a schematic structural diagram showing an example of a plasma processing system which is used when performing the above described liquid affinity-imparting treatment ($O_2$ plasma processing) or liquid repellency-imparting treatment ($CF_4$ plasma processing). The plasma processing system shown in FIG. 18 includes an electrode 42 which is connected to an AC power supply 41, and a sample table 40 which serves as a ground electrode. This sample table 40 can be shifted in the Y axis direction while supporting the substrate P which is being processed. At the bottom surface of the electrode 42, along with a pair of parallel electric discharge generation portions 44, 44 being provided so as to project therefrom and so as to extend in the X axis direction which is perpendicular to the shifting direction, also a dielectric member 45 is provided so as to surround the electric discharge generation portions 44. This dielectric member 45 is a member for preventing abnormal electric discharge of the electric discharge generating portions 44. The lower surface of the electrode 42 which includes the dielectric member 45 is generally planar in form, and is arranged so that a certain space (an electric discharge gap) is defined between the electric discharge generation portions 44 and the dielectric member 45, and the substrate P. Furthermore, in the central portion of the electrode 42, there is provided a gas ejection aperture 46 which is formed to be long and thin along the X axis direction, and which constitutes a portion of a process gas supply section. This gas ejection aperture 46 is connected to a gas introduction aperture 49 via an internal electrode gas conduit 47 and an intermediate chamber 48. A predetermined gas including the process gas which has passed through the gas conduit 47 and has been ejected from the gas ejection aperture 46 flows in the space, spreading between the forward and the backward direction along the shifting direction (the Y axis direction), and escapes to the outside from the front side and the rear side of the dielectric member 45. At the same time as this is occurring, a predetermined voltage is applied to the electrode 42 from the power supply 41, and a gas discharge is thereby caused between the electric discharge generation portions 44, 44 and the sample table 40. An excitation active species of the predetermined gas is generated by the plasma which is created by this gas discharge, and the entire surface of the substrate P which passes through the electric discharge region is continuously processed thereby. In this preferred embodiment of the present invention, the predetermined gas is a mixture of oxygen ($O_2$) or carbon tetrafluoride ($CF_4$) which is the process gas, and a noble gas such as helium (He), argon (Ar) or the like or an inert gas such as nitrogen ($N_2$) or the like, for easily starting the electric discharge at a pressure in the vicinity of atmospheric pressure, and moreover maintaining the stability thereof. In particular, imparting an affinity with liquid and removal of the organic material residue can be performed by using oxygen as the process gas, as has been described above, while liquid repellency-imparting can be performed by using carbon tetrafluoride as the process gas. Furthermore, by performing this $O_2$ plasma processing upon the electrode of, for example, an organic EL device, it is possible to adjust the work function of this electrode.

Various Electro-Optical Devices

Figure 19:
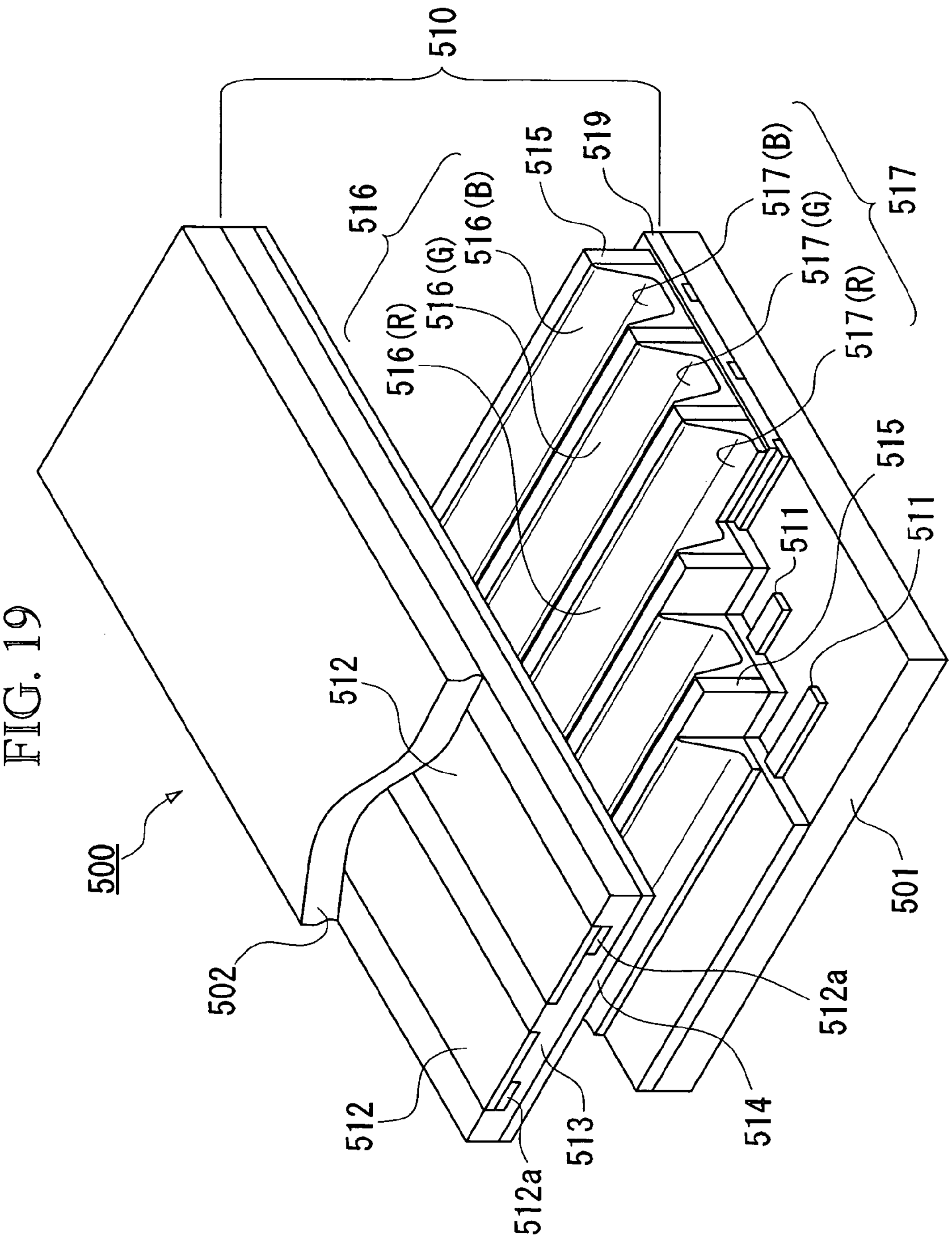
FIG. 19 is a figure showing an example of an electro-optical device according to the present invention, and is a schematic diagram showing a plasma display device.

Next, as an example of an electro-optical device according to a preferred embodiment of the present invention, a plasma display device will be explained. FIG. 19 is an exploded perspective view of the plasma display device 500 of this preferred embodiment of the present invention. This plasma display device 500 includes substrates 501 and 502 which are arranged so as facing one another, and an electric discharge display section 510 which is formed between them. This electric discharge display section 510 is formed as an assembly of a plurality of electric discharge chambers 516. Among these plurality of electric discharge chambers 516, three electric discharge chambers 516—a red color electric discharge chamber 516 (R), a green color electric discharge chamber 516 (B), and a blue color electric discharge chamber (G)—are arranged to be grouped together so as to constitute a single pixel.

Address electrodes 511 are formed upon the upper surface of the substrate 501 in stripe form at predetermined intervals, and a dielectric layer 519 is formed so as to cover the upper surfaces of the address electrodes 511 and the substrate 501.

Separation walls 515 are formed so as to be positioned between adjacent ones of the address electrodes 511 and moreover so as to extend along each of the address electrodes 511. These separation walls 515 include separation walls which lie against the address electrodes 511 to their left and right sides in their widthwise direction, and separation walls which extend in the direction which is orthogonal to the address electrodes 511. Furthermore, electric discharge chambers 516 are defined corresponding to rectangular shaped regions which are partitioned by the separation walls 515. Yet further, phosphors 517 are disposed in the interiors of the rectangular regions which are defined by the separation walls 515. The phosphors 517 is capable of fluorescing in each of the red, green, and blue as appropriate, and are arranged so that red color phosphors 517 (R) are present at the bottom portions of the red color electric discharge chambers 516 (R), green color phosphors 517 (G) are present at the bottom portions of the green color electric discharge chambers 516 (G), and blue color phosphors 517

(B) are present at the bottom portions of the blue color electric discharge chambers 516 (B).

On the other hand, a plurality of display electrodes 512 are formed upon the substrate 502 in stripe form at predetermined intervals, extending in the direction orthogonal to the previously described address electrodes 511. Furthermore, a dielectric layer 513 and a protective layer made from MgO or the like are formed so as to cover these display electrodes 512. The substrate 501 and the substrate 502 are adhered together, so that the address electrodes 511 and the display electrodes 512 are mutually orthogonal to one another. An AC power supply not shown in the figure is connected to the above described address electrodes 511 and display electrodes 512. By supplying power to these electrodes, it is possible to cause excitation of the phosphors 517 in the electric discharge display section 510, and thereby it is possible to provide a color display.

In this preferred embodiment of the present invention, the above described address electrodes 511 and display electrodes 512 are each formed based upon the pattern formation method previously shown and described with reference to FIGS. 1 through 16, using the pattern formation apparatus previously shown and described with reference to FIG. 17. It should be understood that, in the preferred embodiment in which the banks B were used, the banks B were removed by the ashing processing described.

Figure 20:
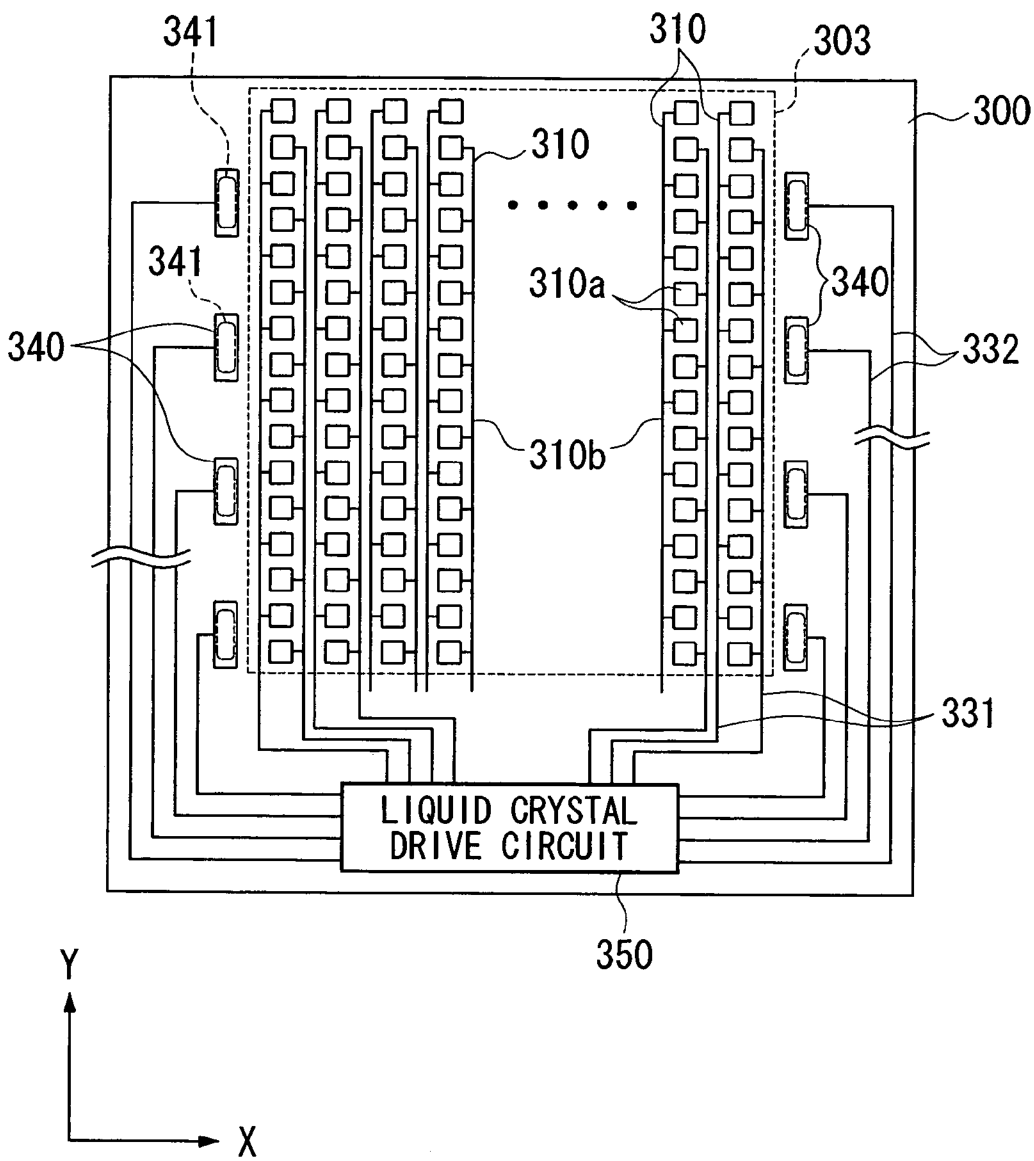
FIG. 20 is a figure showing an example of another electro-optical device according to the present invention, and is a schematic diagram showing a liquid crystal type display device.

Next a liquid crystal device will be explained, as another example of an electro-optical device according to the present invention. FIG. 20 is a figure showing this liquid crystal device according to this preferred embodiment of the present invention. The liquid crystal device according to this preferred embodiment basically includes this first substrate, a second substrate (not shown in the figure) which is provided with scanning electrodes and so on, and a liquid crystal material (also not shown in the figure) which is injected between the first substrate and the second substrate.

As shown in FIG. 20, a plurality of signal electrodes 310 are provided in a multi-layered matrix form over the first substrate 300. In particular, each of these signal electrodes 310 includes a plurality of pixel electrode portions 310*a* which are provided so as to correspond to each pixel, and signal lead wire portions 310*b* which are connected in a multi-layered matrix form, and is extended in the Y direction. Furthermore, the reference numeral 350 denotes a liquid crystal drive circuit which is made as a single chip, and this liquid crystal drive circuit 350 and the one ends of the signal lead wire portions 310*b* (their lower ends in the figure) are connected via first lead wires 331. Yet further, the reference numerals 340 denote through hole terminals, and these through hole terminals and terminals provided upon the second substrate which are not shown in the figure are connected by through hole materials 341. Even further, these through-hole terminals 340 and the liquid crystal drive circuit 350 are connected together via second lead wires 332.

In this preferred embodiment of the present invention, the above described signal lead wire portions 310*b* which are provided upon the first substrate 300, the first lead wires 331, and the second lead wires 332 are all formed based upon the pattern formation method which has been explained above with reference to FIGS. 1 through 16, using the pattern formation apparatus which has been explained above with reference to FIG. 17. Furthermore, it is possible to utilize the material for making the lead wires effectively even which applying the present invention to the manufacture of a substrate for a large sized liquid crystal device, so that it is possible to reduce the cost involved. It should be understood that the devices to which the present invention can be applied are not to be considered as being limited to electro-optical devices; for example, it would also be possible to apply the present invention to a circuit substrate upon which an electrically conductive film wiring pattern was to be formed, or to a wiring pattern for packaging semiconductor devices, or the manufacture of any of a wide variety of other devices.

Figure 21:
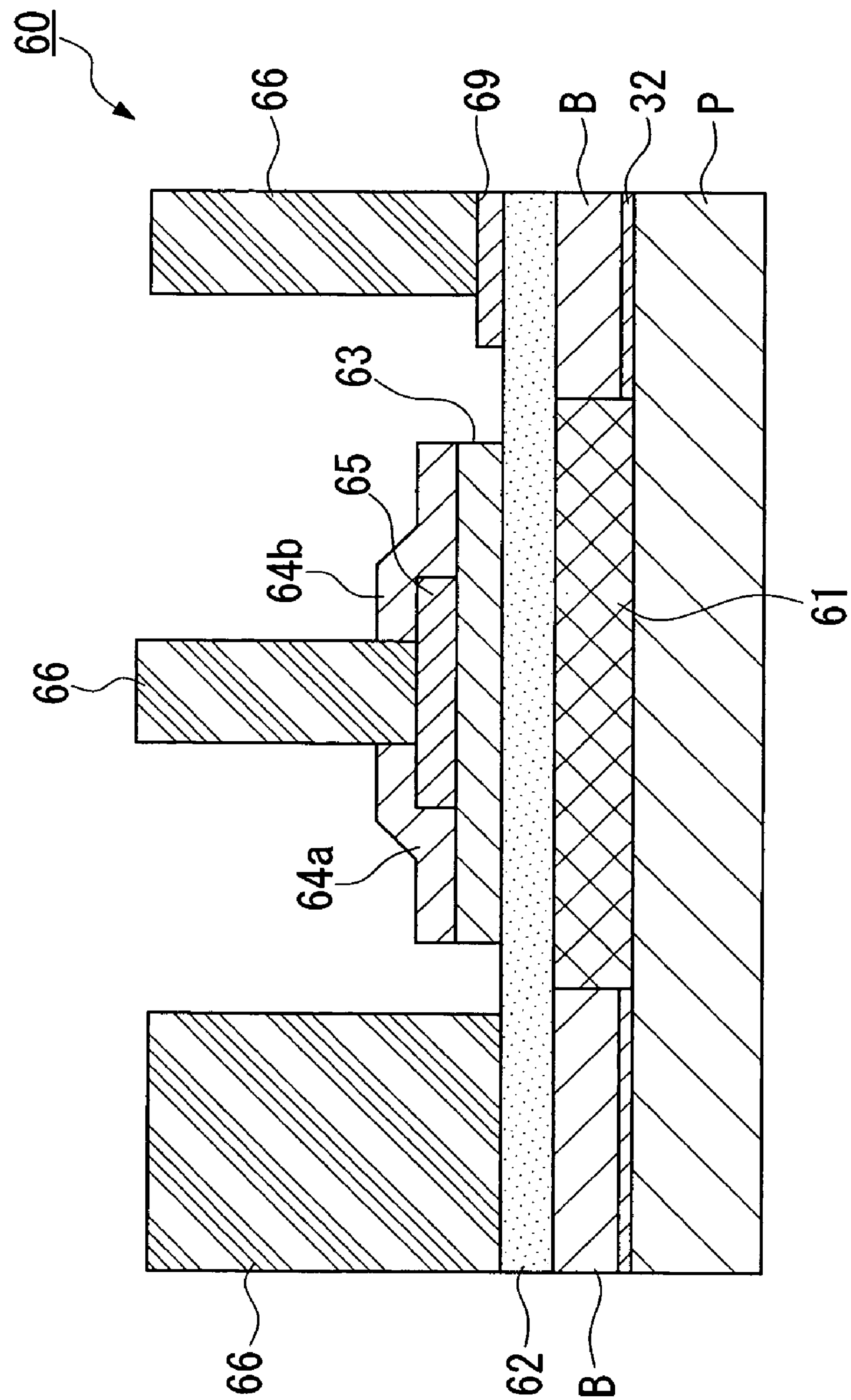
FIG. 21 is a figure showing an example of a device which has been manufactured according to the method for manufacturing a device according to the present invention, and is a schematic diagram showing a thin film transistor device.

FIG. 21 is a figure showing a thin film transistor 60, which is a switching element which is provided to each pixel of a liquid crystal display device. This thin film transistor 60 is formed upon a substrate P by taking advantage of the pattern formation method of the present invention, and its gate lead line 61 is formed upon the substrate P between banks B and B. Over this gate lead line 61 there is layered a semiconductor layer 63 which is made from an amorphous silicon (a-Si) film, with the interposition therebetween of a gate insulation layer 62 which is made from $SiN_x$. The portion of the semiconductor layer 63 which opposes this gate lead wire portion constitutes a channel region. Upon the semiconductor layer 63, for example in order to provide an ohmic junction, there are layered junction layers 64*a* and 64*b* which are made from a layer of $n^+$ type a-Si, and, above the semiconductor layer 63 at the central portion of the channel region, there is provided an insulating etch stop layer 65 which is made from $SiN_x$, in order to protect the channel region. It should be understood that this gate insulation layer 62, the semiconductor layer 63, and the etch stop layer 65 are patterned as shown in the figure by, after vapor deposition (CVD), performing resist coating, exposure to light, development, and photoetching. Furthermore, along with forming in the same manner junction layers 64*a* and 64*b* and a pixel electrode layer 69 which is made from ITO, they are patterned as shown in the figure by performing photoetching. Banks 66 are provided as projecting above each of this pixel electrode 69, this gate insulation layer 62, and this etch stop layer 65, and it is possible to form source leads and drain leads between these banks 66 by ejecting liquid drops of an organic silver compound using the pattern formation apparatus 100 which has been explained above.

Figure 22:
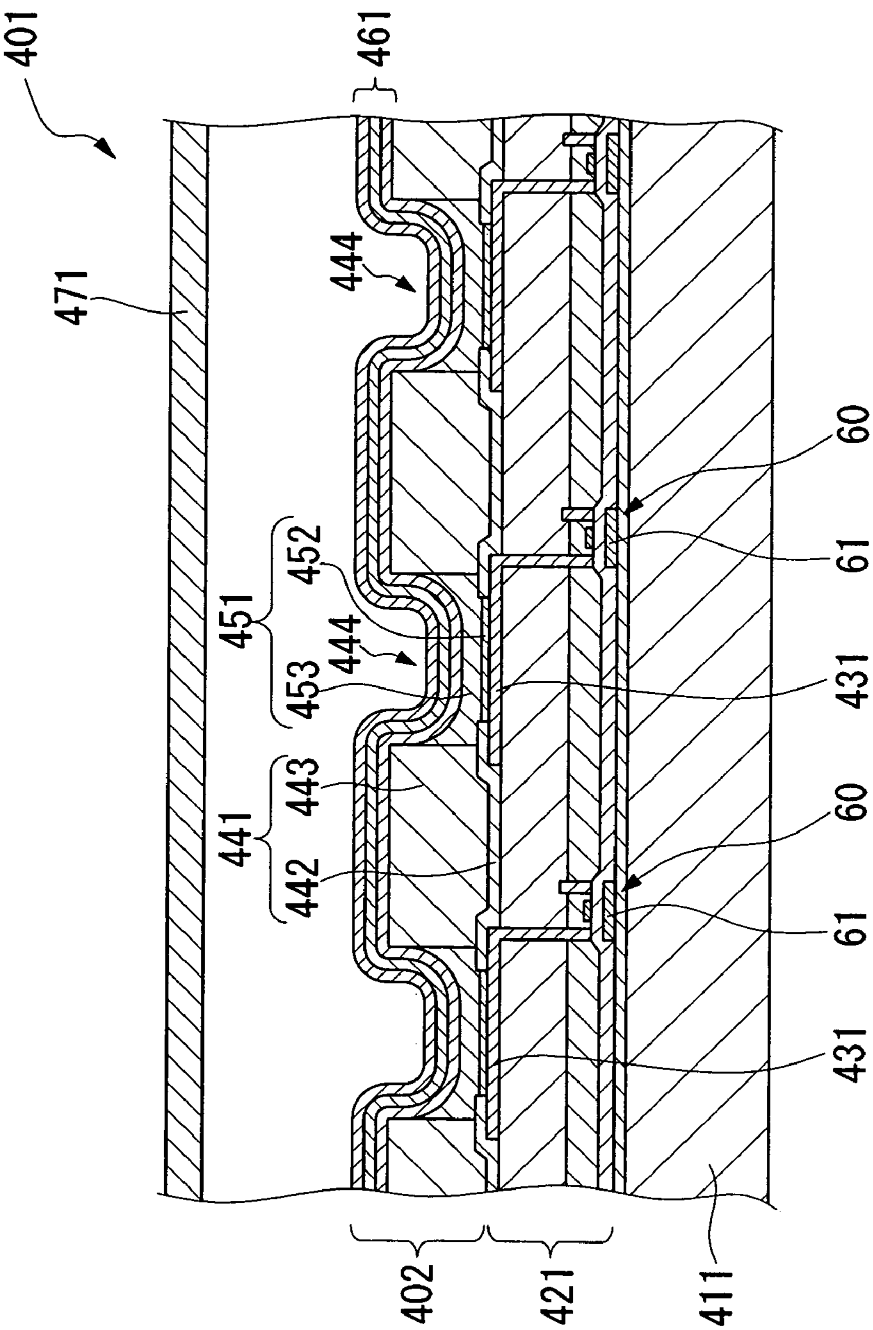
FIG. 22 is a partial magnified sectional view showing an organic EL device.

FIG. 22 is a side sectional view of an organic EL device of which some of the structural elements have been manufactured by the above described liquid drop ejection apparatus 100. The basic structure of this organic EL device will now be explained with reference to FIG. 22.

The organic EL device 401 shown in FIG. 22 includes, in an organic EL element 402, a substrate 411, a circuit element section 421, pixel electrodes 431, bank portions 441, luminescent elements 451, a cathode electrode 461 (i.e., an opposing electrode), and a sealing substrate 471, and is connected to lead wires of a flexible substrate (not shown in the figure) and a drive IC (not shown in the figure either). The circuit element section 421 includes a TFT 60, which is the active element, formed upon the substrate 411, and a plurality of pixel electrodes 431 are arranged upon this circuit element section 421. Gate lead lines 61 which are included in the TFT 60 are formed by the formation method for a wiring pattern according to the above described preferred embodiment of the present invention.

The bank portions 441 are formed in the shape of a lattice between the various pixel electrodes 431, and luminescent elements 451 are formed in the concave open portions 444 which are defined by these bank portions 441. It should be understood that these luminescent elements 451 are variously made from an element which emits red light, an element which emits green light, and an element which emits blue light, and thereby this organic EL device 401 is enabled to implement a full color display. The cathode electrode 461 is made upon the entire surface of the upper portions of the bank portions 441 and the luminescent elements 451, and the sealing substrate 471 is layered over this cathode electrode 461.

The manufacturing process for this organic EL device 401 which includes this organic EL element includes a bank portion formation step of forming the bank portions 441, a plasma processing step for suitably forming the luminescent elements 451, a luminescent element formation step for forming the luminescent elements 451, an opposing electrode formation step for forming the cathode electrode 461, and a sealing step for forming the sealing substrate 471 over the cathode electrode 461 for sealing.

The luminescent element formation step is for forming the luminescent elements 451 by forming the positive hole injection layer 452 and the light emitting layer 453 upon the concave open portions 444, in other words upon the pixel electrode 431, it includes a positive hole injection layer formation step and a light emitting layer formation step. The positive hole injection layer formation step includes a first ejection step of ejecting the liquid material for formation of the positive hole injection layer 452 upon each of the pixel electrodes 431, and a first drying step of forming the positive hole injection layer 452 by drying this liquid material which has been ejected. Furthermore, the light emitting layer formation step includes a second ejection step of ejecting the liquid material for formation of the light emitting layer 453 over the positive hole injection layer 452 which has thus been formed, and a second drying step of forming the light emitting layer 453 by drying this liquid material which has been ejected. It should be understood that, as has been described previously, this light emitting layer 453 is made by disposing three different types of light emitting material—a red light emitting material, a green light emitting material, and a blue light emitting material—corresponding to the three primary colors which are required to be displayed by the finished display unit, and accordingly this second ejection step, in more detail, actually includes three different steps of ejecting these three different types of material in their respective locations.

In this luminescent element formation step, it is possible to utilize the liquid drop ejection apparatus 100 according to the present invention which has been described above for both the first ejection step in which the positive hole injection layer is formed, and also for the second ejection step in which the light emitting layer is formed.

Furthermore, in the above described preferred embodiment of the present invention, it is also possible to utilize the pattern formation method according to the present invention manufacture for manufacturing, not only the gate lead lines for the TFTs (the thin film transistors), but also others of the structural elements, such as the source electrodes, the drain electrodes, the pixel electrodes, and so on. In the following, a method for manufacturing TFTs, one type of active-matrix element, will be explained with reference to FIGS. 23 through 26.

Figure 23:
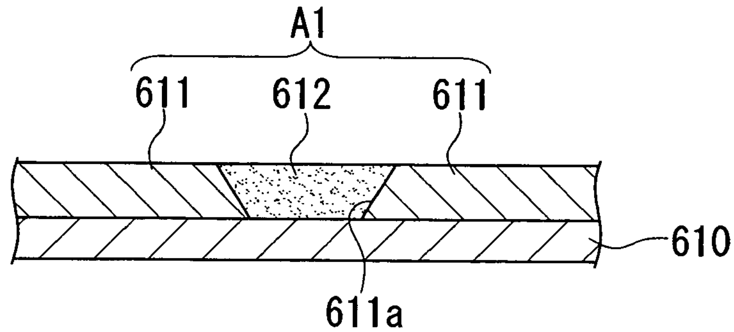
FIG. 23 is a figure for explanation of a step of manufacturing a thin film transistor according to the present invention.

As shown in FIG. 23, first, a first layer of banks 611 for providing grooves 611*a* of one twentieth to one tenth of one pixel pitch is formed upon the upper surface of a glass substrate 610 which has been cleaned, based upon a photolithographic method. For these banks 611, it is necessary to ensure a transparent characteristic and a liquid repellency after their formation, and a suitable material which may be used as a raw material for them will be a high molecular weight material such as acrylic resin, polyimide resin, olefin resin, melamine resin or the like.

Although, in order to endow the banks 611 with a liquid repellency after their formation, it is necessary to perform $CF_4$ plasma processing or the like (i.e., plasma processing using a gas which includes fluorine), instead, it would also be acceptable to add a liquid repelling component (fluorine-containing group or the like) in advance to the raw material for the banks 611 itself. In this case, it would be possible to omit the stage of $CF_4$ plasma processing, and the like.

It is preferable to ensure that the contact angle of the ejected ink on the banks 611 which have thus been endowed with a liquid repellency in the above manner is greater than or equal to 40°, and that the contact angle of the ejected ink on the surface of the glass substrate is less than or equal to 10°. In other words, the result which has been verified by the present inventors by a step of experiment, is that, if acrylic resin is employed as the raw material for the banks 611, it is possible to ensure that the contact angle, after processing with, for example, minute electrically conductive particles in a solvent of tetradecane, is about 54.0° (while before such processing it was less than or equal to 10°). It should be understood that these contact angles were obtained under the process conditions that the plasma power was 550 W, and the flow rate of the carbon tetrafluoride gas was 0.1 liter/min.

After the above described first layer bank formation step, in a gate scan electrode formation step (a first electrically conductive pattern formation step), the gate scan electrodes 612 are formed by ejecting liquid drops including an electrically conductive material by an ink jet method, so as to fill up the grooves 611*a* which are the drawing regions which are separated by the banks 611. When thus forming the gate scan electrodes 612, the pattern formation method according to the present invention is employed.

As the electrically conductive material which is utilized at this time, it is possible and indeed desirable to employ Ag, Al, Au, Cu, palladium, Ni, W—Si, an electrically conductive polymer, or the like. It becomes possible to form a minute wiring pattern for the gate scan electrodes 612 which have been formed in this manner, without any of the material escaping from the grooves 611*a*, since a sufficient liquid repellency has already been imparted to the banks 611.

By the above described process, a first electrically conductive layer Al consisting of the banks 611 and the gate scan electrodes 612, which is provided with a flat upper surface, is formed upon the substrate 610.

Furthermore, in order to obtain a satisfactory result for this ejection into the grooves 611*a*, it is preferable, as shown in FIG. 23, to utilize an tapered shape of these grooves 611*a* (a tapered shape which widens from the bottom towards the opening from which the ejected drops come in). By doing this, it becomes possible for the liquid drops which have been ejected to penetrate sufficiently deeply into the grooves 611*a*.

Figure 24:
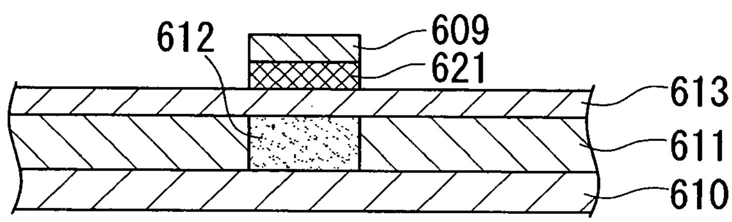
FIG. 24 is a figure for explanation of a step of manufacturing a thin film transistor according to the present invention.

Next, as shown in FIG. 24, a gate insulation layer 613, an active layer 621, and a contact layer 609 are formed in sequence by a plasma CVD method. By varying the source gas species and/or the plasma conditions, the gate insulation layer 613 is formed as a silicon nitride layer, the active layer 621 is formed as an amorphous silicon layer, and the contact layer is formed as an $n^+$-type silicon layer. Although, during this formation by the CVD method, thermal hysteresis of 300° C. to 350° C. becomes necessary, it is possible to avoid problems related to transparency and heat resistance by using an inorganic substance for the banks.

Figure 25:
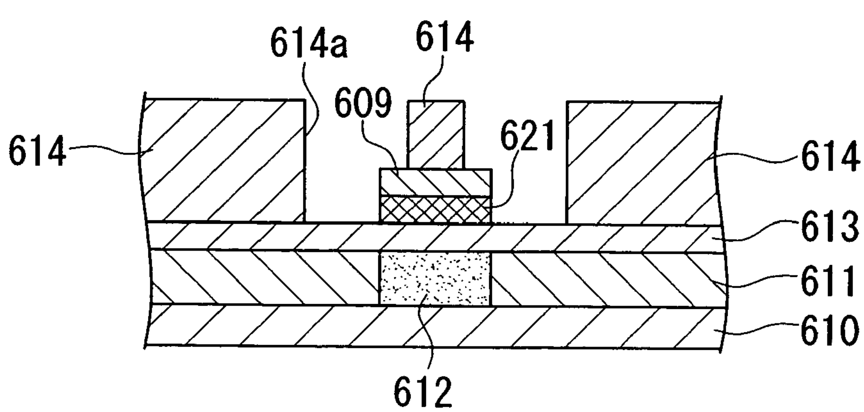
FIG. 25 is a figure for explanation of a step of manufacturing a thin film transistor according to the present invention.

After the above described semiconductor layer formation step, in a second layer bank formation step, as shown in FIG. 25, a second series of banks 614, for providing grooves 614*a* which are of width one twentieth to one tenth of one pixel pitch and which extend orthogonally to the grooves 611*a*, are formed upon the upper surface of the gate insulation layer 613, based upon a photolithographic method. As the raw material for these banks 614, it is necessary to utilize a material which, after formation, will be endowed with a transparent characteristic and a liquid repellency; such a raw material may desirably be a high molecular weight material, such as, for example, acrylic resin, polyimide resin, olefin resin, melamine resin, or the like.

Although, in order to impart a liquid repellency to the banks 614 after this processing, it is necessary to perform $CF_4$ plasma processing or the like (plasma processing using a gas which includes fluorine), instead of this, it would also be acceptable to add a liquid repelling component (fluorine-containing group or the like) in advance in the raw material for the banks 614 itself. In this case, it would be possible to omit the stage of $CF_4$ plasma processing, and the like.

It is preferable to ensure that the contact angle of the ejected ink on the banks 614 which have thus been endowed with a liquid repellency in the above manner is greater than or equal to 40°.

Figure 26:
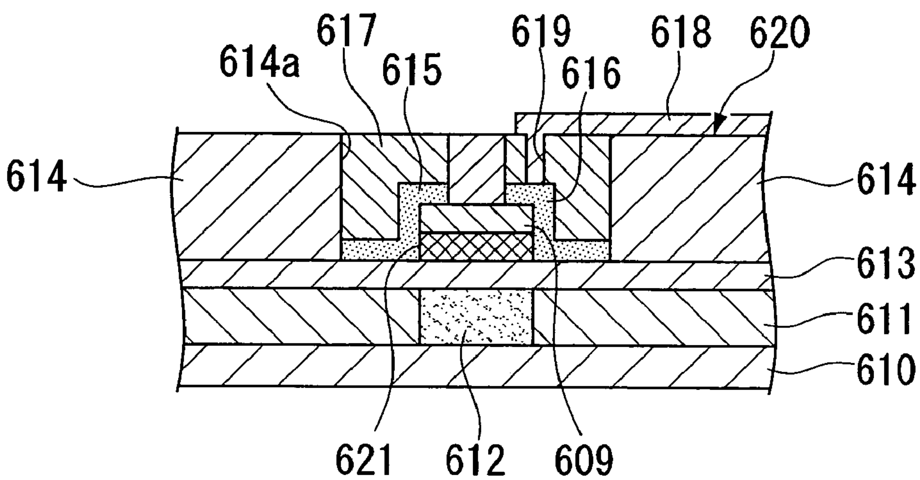
FIG. 26 is a figure for explanation of a step of manufacturing a thin film transistor according to the present invention.

After the above described second layer bank formation step, in a source and drain electrode formation step (a second electrically conductive layer formation step), by ejecting liquid drops of a material which includes an electrically conductive material with an ink jet apparatus so as to fill up within the grooves 614*a*, which are the drawing regions which are separated by the banks 614, the source electrodes 615 and source electrodes 616 are formed so as to intersect the gate scanning electrodes 612, as shown in FIG. 26. The pattern formation method according to the present invention is utilized when thus forming the source electrodes 615 and the drain electrodes 616.

As the electrically conductive material which is utilized at this time, it is possible and indeed desirable to employ Ag, Al, Au, Cu, palladium, Ni, W—Si, an electrically conductive polymer, or the like. It becomes possible to form a minute wiring pattern for the source electrodes 615 and the drain electrodes 616 which have been formed in this manner, without any of the material escaping from the grooves 614*a*, since a sufficient liquid repellency has already been imparted to the banks 614.

Furthermore, an insulating material 617 is disposed so as to fill up the grooves 614*a* in which the source electrodes 615 and the drain electrodes 616 have been disposed. By the above process, a flat upper surface 620 is formed above the substrate 610, which consists of the banks 614 and the insulating material 617.

Along with forming contact holes 619 in the insulating material 617, pixel electrodes (ITO) 618 are formed by patterning above the upper surface 620, and, by connecting together the drain electrodes 616 and to the pixel electrodes 618 via these contact holes 619, the TFTs are formed.

Figure 27:
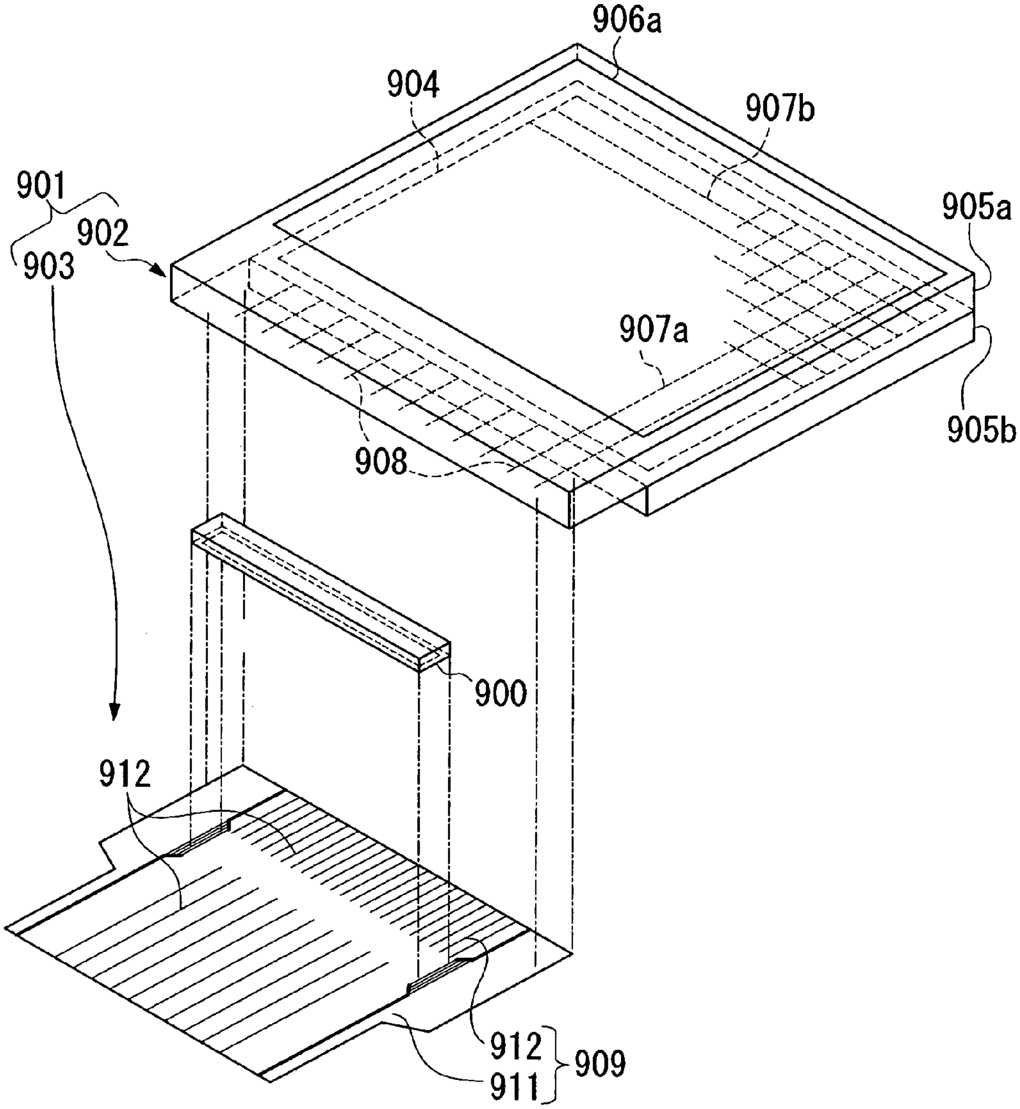
FIG. 27 is a figure showing another embodiment of a liquid crystal display device.

FIG. 27 is a figure showing another preferred embodiment of a liquid crystal display device.

The liquid crystal display device (i.e., the electro-optical device) 901 shown in FIG. 27 generally includes a color liquid crystal panel (electro-optical panel) 902, and a circuit substrate 903 which is connected to this liquid crystal panel 902. Furthermore, according to requirements, an illumination device such as a backlight or the like, and other supplementary devices, may be provided to this liquid crystal panel 902.

This liquid crystal panel 902 includes a pair of substrates 905*a* and 905*b* which are fixed together by a seal material 904, and liquid crystal material is filled in the so called cell gap which is defined between these substrates 905*a* and 905*b*. These substrates 905*a* and 905*b* are generally made from a light transparent material, such as for example glass, a synthetic resin, or the like. On the outer surfaces of the substrates 905*a* and 905*b*, there are adhered polarizing plate 906*a* and another polarizing plate. It should be understood that, in FIG. 27, the other polarizing plate is omitted from the drawing.

Furthermore, electrodes 907 are formed upon the inner surface of the substrate 905*a*, while electrodes 907*b* are formed upon the inner surface of the substrate 905*b*. These electrodes 907*a* and 907*b* are made in stripe form, or in the form of letters, digits, or other suitable patterns. Furthermore, these electrodes 907*a* and 907*b* are made from a light transparent material, such as for example ITO (Indium Tin Oxide) or the like. The substrate 905*a* has an extension portion which is extended further out than the substrate 905*b*, and a plurality of terminals 908 are formed upon this extension portion. When forming the electrodes 907*a* upon the substrate 907*a*, these terminals 908 are formed at the same time as the electrodes 907*a*. Accordingly, these terminals 908 are formed from, for example, ITO or the like. These terminals 908 extend from the electrodes 907*a* as members which are integral therewith, and also include portions which are connected to the electrodes 907*b* via electrically conductive members which are not shown in the figure.

In predetermined positions upon a lead wire substrate 909 in a circuit substrate 903, there are provided semiconductor elements 900 which serve as liquid crystal drive ICs. It should be understood that resistors, capacitors, and other chip components may also be arranged in predetermined positions at locations other than those where these semiconductor elements 900 are positioned, although no such components are shown in the figure. This lead wire substrate 909 is manufactured by forming a wiring pattern 912 by patterning a metallic layer of Cu or the like which has been formed upon a base substrate 911 which is endowed with flexibility, such as for example one made from a polyimide material or the like.

In this preferred embodiment of the present invention, the electrodes 907*a* and 907*b* of the liquid crystal panel 902, and the wiring pattern 912 of the circuit substrate 903, are made by the above described method for manufacturing a device.

According to the liquid crystal display device of this preferred embodiment of the present invention, it is possible to obtain a high quality liquid crystal display device in which non-uniformity of the electrical characteristics has been eliminated.

It should be understood that, although the above described example is a passive type liquid crystal panel, it would also be possible to apply the present invention to an active matrix type liquid crystal panel. In this case, thin film transistors (TFT) would be formed upon one substrate, and a pixel electrode would be formed in correspondence to each TFT. Furthermore, it would also be possible to form the various lead wires which are electrically connected to each of the TFTs (the gate lead line and the source lead line) using an ink jet technique such as the one described above. On the other hand, opposing electrodes and so on are also formed upon the opposing substrate. It is thus also possible to apply the present invention to this type of active matrix liquid crystal panel.

Electronic Device

Figure 28:
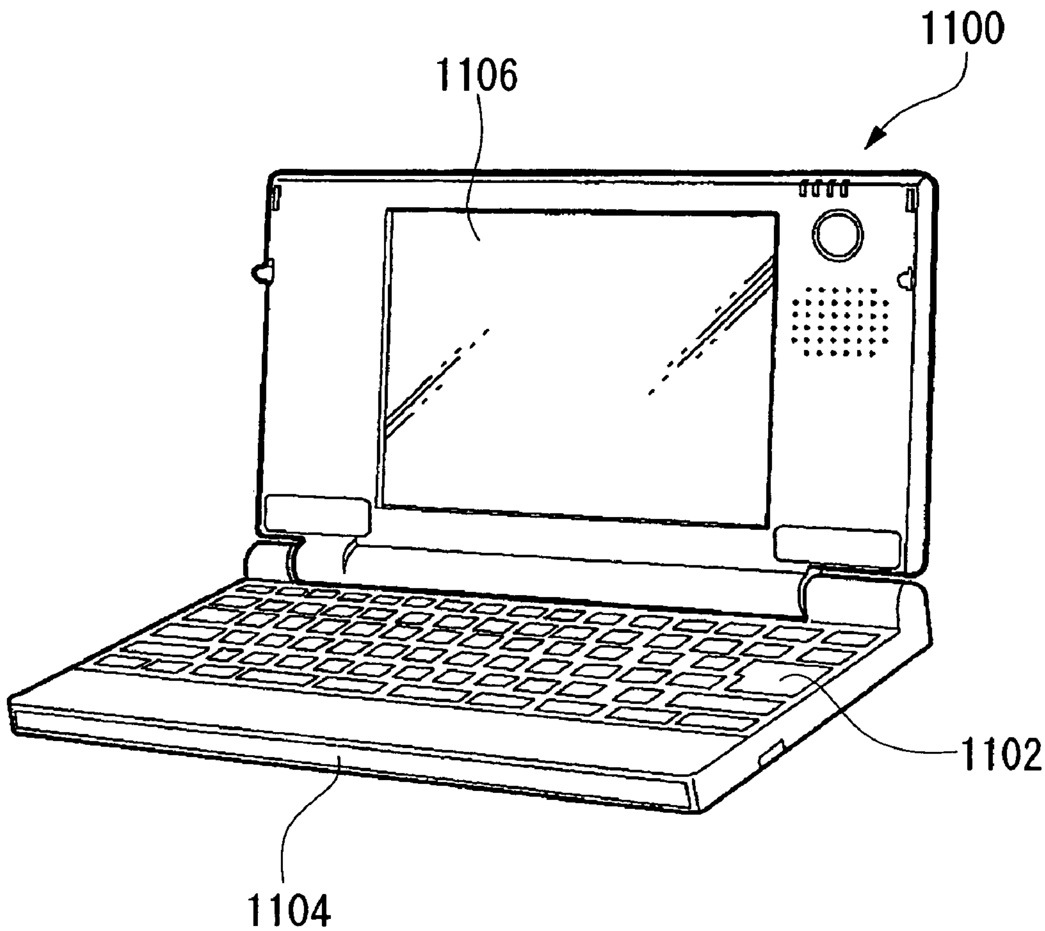
FIG. 28 is a figure showing a concrete example of an electronic device according to the present invention.

Next, an example of an electronic device according to the present invention will be explained. FIG. 28 is a perspective view showing the structure of a mobile type personal computer (an information processing device) which includes a display device according to the above described preferred embodiment of the present invention. In this figure, the personal computer 1100 includes a body 1104 which includes a keyboard 1102, and a display device unit which includes the above described electro-optical device 1106. Due to this, it is possible to provide an electronic device which includes a display section which has superior brightness and whose light emitting efficiency is high.

It should be understood that, in addition to the examples described above, as other examples, it is possible to suggest a portable telephone, a wristwatch type electronic device, a liquid crystal television, a video tape recorder of a viewfinder type or a monitor direct vision type, a car navigation device, a pager, a personal digital assistant, a calculator, a word processor, a work station, a video telephone, a POS terminal, electronic paper, a device which is equipped with a touch panel, or the like. The electro-optical device according to the present invention can be applied to the display section of any of these types of display device. It should be understood that the electronic device according to this preferred embodiment of the present invention may not only be an electronic device which is equipped with a liquid crystal device, but, alternatively, may be an electronic device which is equipped with some other type of electro-optical device, such as an organic electroluminescent display device, a plasma display device, or the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A pattern formation method for forming a film pattern upon a substrate, comprising the steps of:

forming banks in a predetermined pattern upon said substrate;

disposing liquid drops of a functional liquid at end portions of groove portions which are defined between said banks; and after having disposed said drops at said end portions of said groove portions, disposing liquid drops in positions of said groove portions other than said end portions thereof.

2. A pattern formation method according to claim 1, further comprising the step of imparting a liquid repellency to said banks.

3. A pattern formation method according to claim 1, further comprising the step of imparting an affinity with liquid to the bottom portions of said groove portions.

4. A pattern formation method according to claim 1, said step of disposing said liquid drops in positions after having disposed said drops at said end portions of said groove portions further comprising the step of disposing a plurality of liquid drops in sequence toward central portions of said groove portions.

5. A pattern formation method according to claim 1, wherein an electrically conductive material is included in said functional liquid.

6. A method for manufacturing a device, comprising the step of forming a film pattern upon a substrate, wherein said film pattern is formed upon said substrate according to a pattern formation method according to claim 1.

7. An electro-optical device comprising a device which is manufactured by a method for manufacturing a device according to claim 6.

8. An electronic device, comprising an electro-optical device according to claim 7.

9. A pattern formation method for forming a film pattern upon a substrate, comprising the steps of:

providing a liquid repelling layer in a region which surrounds a pattern formation region upon said substrate in which a predetermined pattern is to be formed;

disposing liquid drops of a functional liquid at end portions of said pattern formation region; and after having disposed said drops at said end portions, disposing liquid drops at positions of said pattern formation region other than said end portions thereof.

10. A pattern formation method according to claim 9, wherein said liquid repelling layer is a mono molecular film which is formed upon the surface of said substrate.

11. A pattern formation method according to claim 10, wherein said mono molecular film is a self assembled layer made from organic molecules.

12. A pattern formation method according to claim 9, wherein said liquid repelling layer is a fluoride polymer layer.

13. A pattern formation method according to claim 9, further comprising the step of imparting an affinity with liquid to said pattern formation region.

14. A pattern formation method according to claim 9, said step of disposing said liquid drops in positions after having disposed said drops at said end portions of said groove portions further comprising the step of disposing a plurality of liquid drops in sequence toward central portions of said groove portions.

15. A pattern formation method according to claim 9, wherein said step of disposing a plurality of liquid drops comprises:

a first disposing step of disposing a plurality of liquid drops upon said substrate so as not to mutually overlap one another; and a second disposing step of disposing a plurality of liquid drops upon said substrate between said plurality of liquid drops which were disposed upon said substrate during said first disposing step.

16. A pattern formation method according to claim 9, wherein an electrically conductive material is included in said functional liquid.

17. A method for manufacturing a device, comprising the step of forming a film pattern upon a substrate, wherein said film pattern is formed upon said substrate using a pattern formation method according to claim 9.

18. An electro-optical device comprising a device which is manufactured using a method according to claim 17.

19. An electronic device comprising an electro-optical device according to claim 18.

20. A method for manufacturing an active matrix substrate, comprising:

a first step of forming a gate lead line upon a substrate;

a second step of forming a gate insulation layer over said gate lead line;

a third step of forming a semiconductor layer over said gate insulation layer;

a fourth step of forming a source electrode and a drain electrode over said gate insulation layer;

a fifth step of disposing an insulation material over said source electrode and said drain electrode; and a sixth step of forming a pixel electrode which is electrically connected to said drain electrode;

wherein at least one of said first step, said fourth step, and said sixth step comprises the steps of:

forming banks corresponding to a predetermined pattern upon said active matrix substrate;

disposing liquid drops at end portions of groove portions which are defined between said banks; and after having disposed said liquid drops at said end portions of said groove portions, disposing liquid drops in positions of said groove portions other than said end portions thereof.

21. A method for manufacturing an active matrix substrate, comprising:

a first step of forming a gate lead line upon a substrate;

a second step of forming a gate insulation layer over said gate lead line;

a third step of forming a semiconductor layer over said gate insulation layer;

a fourth step of forming a source electrode and a drain electrode over said gate insulation layer;

a fifth step of disposing an insulation material over said source electrode and said drain electrode; and a sixth step of forming a pixel electrode which is electrically connected to said drain electrode;

wherein at least one of said first step, said fourth step, and said sixth step comprises the steps of:

providing a liquid repelling layer in a region which surrounds a pattern formation region which has been set upon said active matrix substrate and in which a predetermined pattern is to be formed; and disposing liquid drops at end portions of said pattern formation region; and after having disposed said liquid drops at said end portions of said pattern formation region, disposing liquid drops in positions of said pattern formation region other than said end portions thereof.

* * * * *